(12) United States Patent
Oseto et al.

(10) Patent No.: US 11,094,733 B2
(45) Date of Patent: Aug. 17, 2021

(54) SEMICONDUCTOR DEVICE, SEMICONDUCTOR MEMORY, PHOTOELECTRIC CONVERSION DEVICE, MOVING UNIT, MANUFACTURING METHOD OF PHOTOELECTRIC CONVERSION DEVICE, AND MANUFACTURING METHOD OF SEMICONDUCTOR MEMORY

(71) Applicant: CANON KABUSHIKI KAISHA, Tokyo (JP)

(72) Inventors: Akira Oseto, Kawasaki (JP); Tatsunori Kato, Kawasaki (JP); Ryunosuke Ishii, Tokyo (JP); Takanori Watanabe, Yamato (JP); Atsushi Suzuki, Zama (JP); Koichiro Iwata, Kawasaki (JP); Kazuo Yamazaki, Yokohama (JP); Hideaki Takada, Yokohama (JP); Akira Ohtani, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 10 days.

(21) Appl. No.: 16/600,885

(22) Filed: Oct. 14, 2019

(65) Prior Publication Data
US 2020/0127035 A1    Apr. 23, 2020

(30) Foreign Application Priority Data

Oct. 18, 2018  (JP) .............................. JP2018-196846
May 9, 2019   (JP) .............................. JP2019-089187

(51) Int. Cl.
*H01L 27/146*  (2006.01)
*B60R 11/04*   (2006.01)
*H01L 27/11*   (2006.01)

(52) U.S. Cl.
CPC ........ *H01L 27/14643* (2013.01); *B60R 11/04* (2013.01); *H01L 27/1104* (2013.01); *H01L 27/14689* (2013.01); *B60R 2300/8093* (2013.01)

(58) Field of Classification Search
CPC ........... H01L 27/14643; H01L 27/0207; H01L 27/1104; H01L 27/14689; H01L 27/1116;
(Continued)

(56) References Cited

U.S. PATENT DOCUMENTS

2008/0296645 A1*  12/2008  Itonaga ............. H01L 27/14689
                                                257/294
2017/0358614 A1*  12/2017  Azami .................... H01L 27/14
(Continued)

FOREIGN PATENT DOCUMENTS

JP    2000-058675 A    2/2000
JP    2006-523962 A   10/2006
(Continued)

*Primary Examiner* — Sitaramarao S Yechuri
(74) *Attorney, Agent, or Firm* — Canon U.S.A., Inc. IP Division

(57) ABSTRACT

A semiconductor device has a first transistor of a first conductivity type and a second transistor of a second conductivity type, the first transistor is arranged in an active region of a semiconductor substrate, and a gate electrode and the active region overlap with each other in a plan view and also have a portion located between the source and the drain of the first transistor of the semiconductor substrate. In the channel width direction, an impurity concentration of the second conductivity type is higher at the end than on the center side of the portion.

22 Claims, 19 Drawing Sheets

(58) Field of Classification Search
CPC ............. B60R 11/04; B60R 2300/8093; B60R 2011/004
See application file for complete search history.

(56) References Cited

U.S. PATENT DOCUMENTS

2018/0115723 A1\* 4/2018 Takayanagi ............ H04N 5/225
2018/0220094 A1\* 8/2018 Yang ................. H01L 27/14612

FOREIGN PATENT DOCUMENTS

| JP | 2009-004587 A | 1/2009 |
| JP | 2013-197596 A | 9/2013 |
| JP | 2017-069231 A | 4/2017 |

\* cited by examiner

FIG. 14

| BLOCK NAME | FIRST TYPE TRANSISTOR |
|---|---|
| UNIT CELL PORTION 1000 | ○ |
| POWER SOURCE CIRCUIT 1003 | ○ |
| SIGNAL AMPLIFIER CIRCUIT 1004 | ○ |
| AD CONVERTER CIRCUIT 1005 | ○ |
| VERTICAL SCANNING CIRCUIT 1002, HORIZONTAL SCANNING CIRCUIT 1015 | × |
| RAMP GENERATION CIRCUIT 1006 | × |
| COLUMN MEMORY CIRCUIT 1007 | × |
| COUNTER CIRCUIT 1008 | × |
| TG 1009 | × |
| SIGNAL PROCESSING CIRCUIT 1010 | × |
| SIGNAL OUTPUT CIRCUIT 1011 | × |

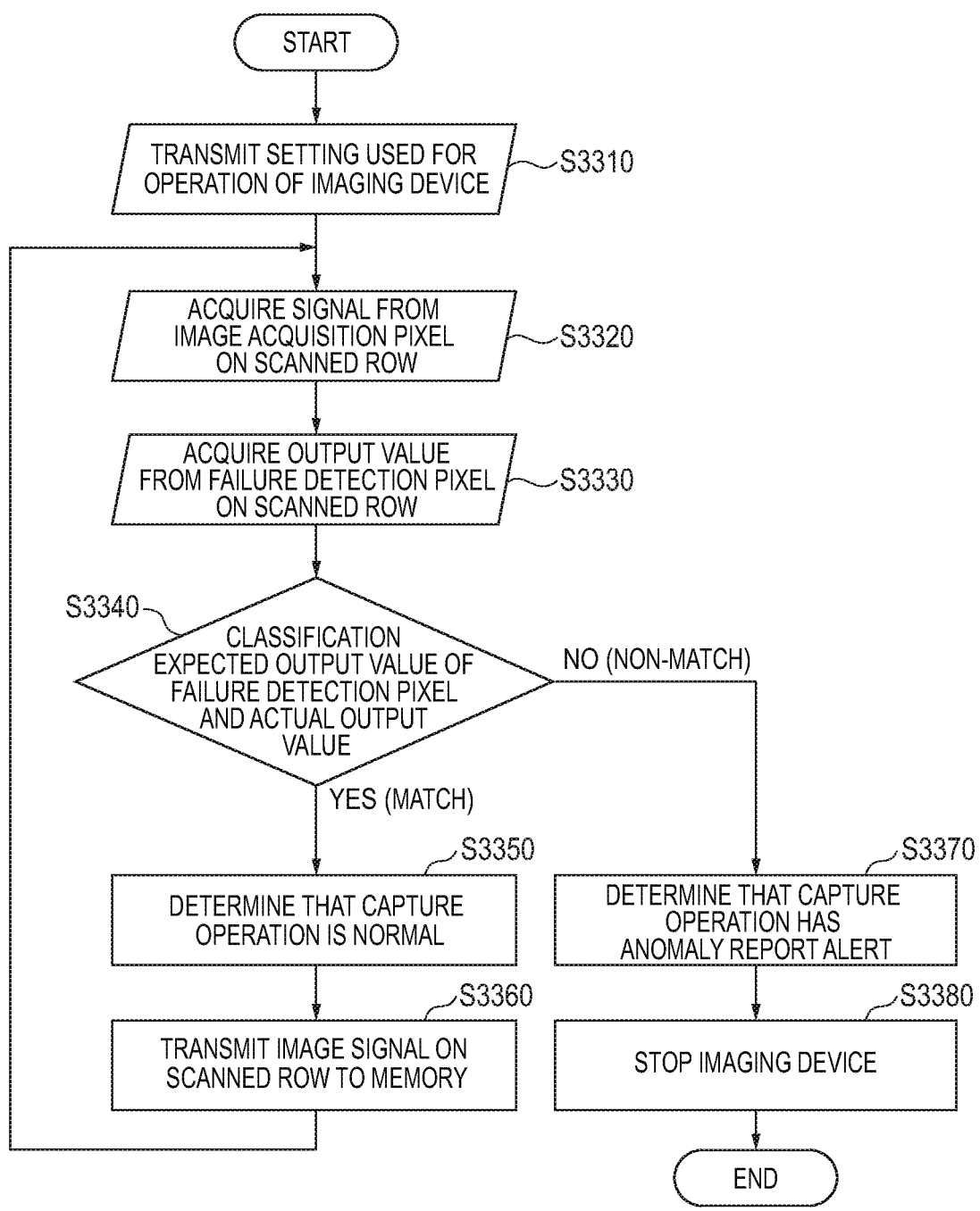

SEMICONDUCTOR DEVICE, SEMICONDUCTOR MEMORY, PHOTOELECTRIC CONVERSION DEVICE, MOVING UNIT, MANUFACTURING METHOD OF PHOTOELECTRIC CONVERSION DEVICE, AND MANUFACTURING METHOD OF SEMICONDUCTOR MEMORY

BACKGROUND OF THE INVENTION

Field of the Invention

The aspect of the embodiments relates to a semiconductor device, a semiconductor memory, a photoelectric conversion device, a moving unit, a manufacturing method of the photoelectric conversion device, and a manufacturing method of the semiconductor memory.

Description of the Related Art

Japanese Patent Application Laid-Open No. 2000-058675 discloses a technology to ensure circuit operation stability by using different thresholds of transistors in a Static Random Access Memory (SRAM)-type semiconductor memory. Further, Japanese Patent Application Laid-Open No. 2017-069231 discloses that the shape of a gate electrode or the film thickness of a gate insulation film is changed in order to reduce noise of a transistor.

SUMMARY OF THE INVENTION

One aspect of the embodiments is a memory having a Static Random Access Memory (SRAM)-type unit cell including a first transistor of a first conductivity type and a second transistor of a second conductivity type, the first transistor is arranged in an active region of a semiconductor substrate, the active region overlaps with a gate electrode of the first transistor and includes a portion located between a source and a drain of the first transistor, the portion is arranged across a first position, a second position, and a third position aligning in order along a channel width direction of the first transistor, the portion includes a first semiconductor region of the second conductivity type arranged in the first position and a second semiconductor region of the second conductivity type arranged in the second position, and the impurity concentration of the first semiconductor region is higher than the impurity concentration of the second semiconductor region.

Another aspect of the embodiments is a method of a semiconductor memory having a Static Random Access Memory (SRAM)-type unit cell including a first transistor of the first conductivity type and a second transistor of the second conductivity type, and the method includes preparing a semiconductor substrate having a first region and a second region, forming the first groove in the first region and a second groove in the second region by using a first mask pattern, forming a second mask pattern having an opening, on the first mask pattern, that covers the first groove and exposes the second groove, performing implantation of impurity ions of the first conductivity on the semiconductor substrate via the second groove by using the first mask pattern and the second mask pattern, forming a first element isolation portion having the first groove and a second element isolation portion having the second groove by embedding an insulator in the first groove and the second groove, and forming the first transistor in the first region and the second transistor in the second region.

Another aspect of the embodiments is a method of a semiconductor memory having a Static Random Access Memory (SRAM)-type unit cell including a first transistor of the first conductivity type and a second transistor of the second conductivity type, and the manufacturing method includes preparing a substrate having a first region and a second region, forming the first groove in the first region and a second groove in the second region by using a first mask pattern, forming a second mask pattern having an opening, on the first mask pattern, that covers the first groove and exposes the second groove, performing implantation of impurity ions of the first conductivity on the semiconductor substrate via the second groove by using the first mask pattern and the second mask pattern, forming a first element isolation portion having the first groove and a second element isolation portion having the second groove by embedding an insulator in the first groove and the second groove, and forming the first transistor in the first region and the second transistor in the second region.

Another aspect of the embodiments is a semiconductor device having a CMOS circuit including a first transistor of a first conductivity type and a second transistor of a second conductivity type, the first transistor is arranged in an active region of a semiconductor substrate, the first transistor has a portion at which a gate electrode of the first transistor and the active region overlap with each other and that is located between the source and the drain of the first transistor of the semiconductor substrate, in the portion, a first semiconductor region of the second conductivity type is arranged at a first position and a second semiconductor region of the second conductivity type is arranged at a second position that is between the first position and a third position along a channel width direction of the first transistor, and the impurity concentration of the first semiconductor region is higher than the impurity concentration of the second semiconductor region.

Yet another aspect of the embodiments has a unit cell portion in which a unit cell having a photoelectric conversion element is arranged and a readout unit used for reading out a signal from the unit cell portion, the readout unit has at least one first transistor of the first conductivity type, the first transistor is arranged in an active region of a semiconductor substrate, the active region overlaps with a gate electrode of the first transistor and includes a first portion located between a source and a drain of the first transistor, the first portion is arranged across a first position, a second position, and a third position aligned in order along a channel width direction of the first transistor, the first portion includes a first semiconductor region of the second conductivity type arranged at the first position and a second semiconductor region of the second conductivity type arranged at the second position, and the impurity concentration of the first semiconductor region is higher than the impurity concentration of the second semiconductor region.

Further features of the disclosure will become apparent from the following description of exemplary embodiments with reference to the attached drawings.

BRIEF DESCRIPTION OF THE DRAWINGS

FIG. 14 is a table illustrating a photoelectric conversion device according to an eighth embodiment.

FIG. 19 is a diagram illustrating an operation flow of the moving unit.

DESCRIPTION OF THE EMBODIMENTS

Each embodiment will be described below with reference to the drawings. In the description of each embodiment, with respect to the same features as those of other embodiments, the description thereof may be omitted. The polarity of an N-type or a P-type in the descriptions below may be changed. In such a case, the change can be applied by changing the polarity of a semiconductor region, changing the control signal potential, or the like. In the descriptions below, electrical connection means connection to a common node. Further, modifications such as inserting another element (a switch, a buffer, or the like) can be appropriately made in a connection relationship between circuit elements.

First Embodiment

Figure 1:
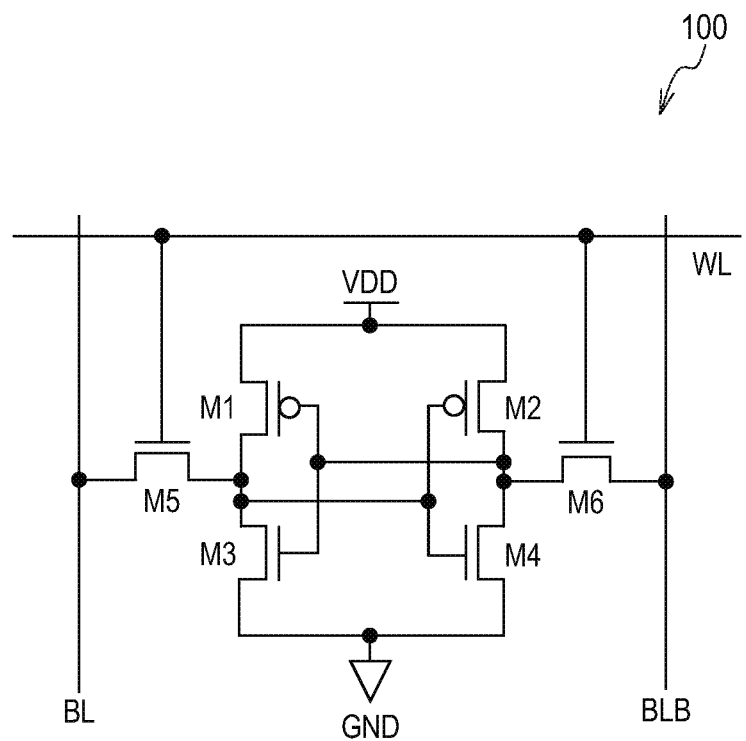
FIG. 1 is an equivalent circuit diagram illustrating a unit cell of a semiconductor memory according to a first embodiment.

FIG. 1 is an equivalent circuit diagram illustrating a unit cell of a semiconductor memory according to the present embodiment. The semiconductor memory according to the present embodiment is a Static Random Access Memory (hereinafter, referred to as SRAM). In the SRAM, a unit cell 100 is a bit cell that holds a signal of one bit. A plurality of unit cells 100 are arranged in the SRAM.

Each unit cell 100 has at least six transistors M1 to M6. Each of the two transistors M1 and M2 is a P-type MOS transistor and may function as a transistor for loading (load transistor) of the SRAM. Each of two transistors M3 and M4 is an N-type MOS transistor and may function as a transistor for driving (driver transistor) of the SRAM. Each of two transistors M5 and M6 is an N-type MOS transistor and may function as a transistor for transferring (transfer transistor) of the SRAM. Respective transistors are connected as described below.

The sources of the two transistors M1 and M2 are electrically connected to a node VDD of the power source voltage. The sources of the two transistors M3 and M4 are electrically connected to a node GND of a ground power source voltage. The two transistors M1 and M3 of different polarities form one inverter, and the two transistors M2 and M4 of different polarities form one inverter. Specifically, the drain of the transistor M1 and the drain of the transistor M3 are electrically connected to each other, and gate electrodes of the transistor M1 and the transistor M3 are electrically connected to each other. In the same manner, the drain of the transistor M2 and the drain of the transistor M4 are electrically connected to each other, and gate electrodes of the transistor M2 and the transistor M4 are electrically connected to each other. Further, these two inverters form one flip-flop. The gate electrode of the transistor M1 and the drain of the transistor M2 are electrically connected to each other, and the gate electrode of the transistor M2 and the drain of the transistor M1 are electrically connected to each other.

The transistor M5 may control conduction between one flip-flop and one bit line BL. The transistor M6 may control conduction between one flip-flop and one bit line BLB. Gate electrodes of the two transistors M5 and M6 are electrically connected to one word line WL. In the first embodiment, these six transistors form the unit cell 100 of the SRAM.

Figure 2:
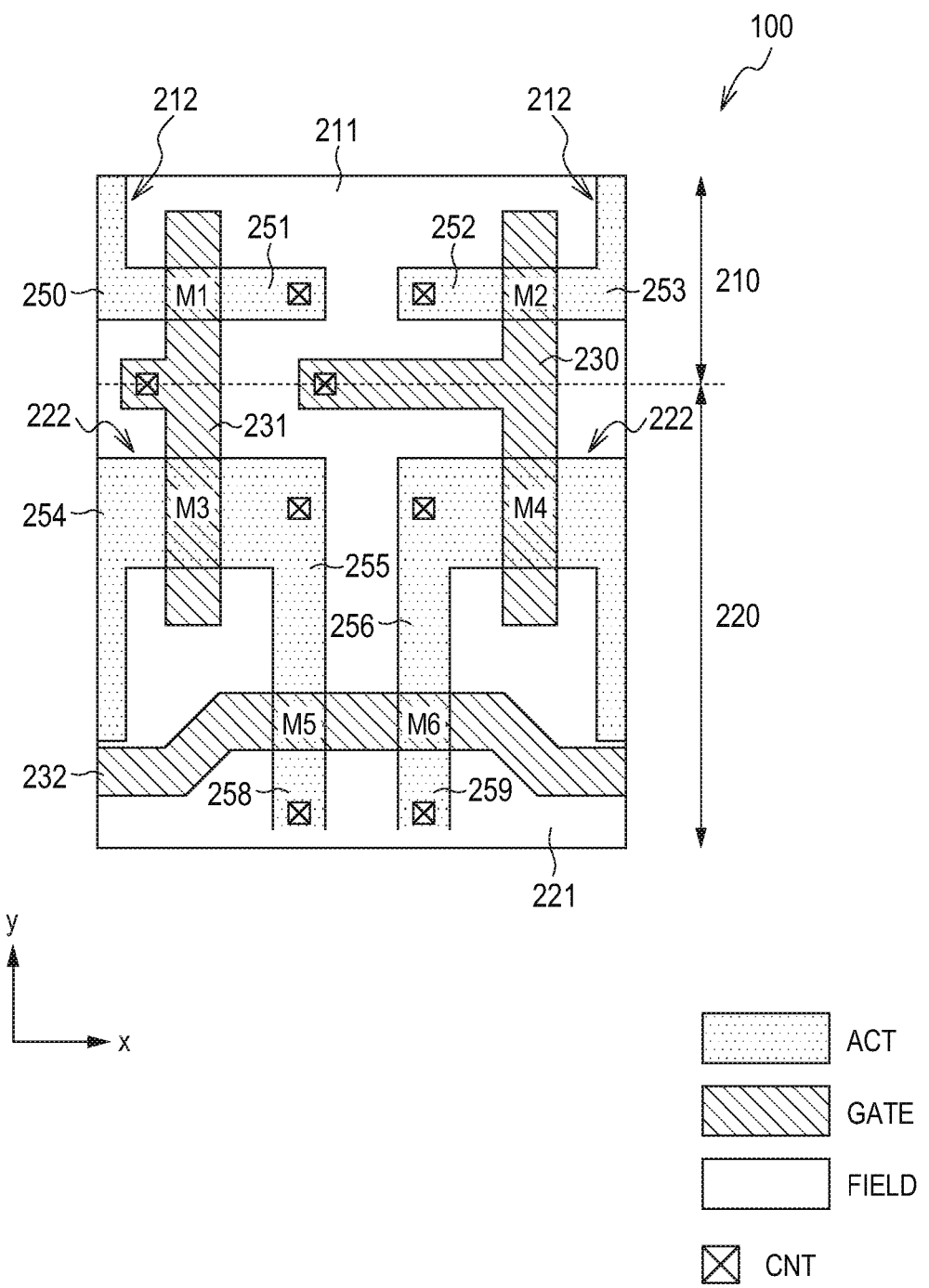
FIG. 2 is a schematic plan view illustrating the unit cell of the semiconductor memory according to the first embodiment.

FIG. 2 is a schematic plan view illustrating the unit cell 100 corresponding to FIG. 1. FIG. 2 illustrates arrangement of the transistors projected onto the surface of a semiconductor substrate. The surface of the semiconductor substrate has an X-direction and a Y-direction that is orthogonal to the X-direction. The unit cells 100 are arranged in two regions 210 and 220. The region 210 is a region in which an N-type semiconductor region is provided, and the region 220 is a region in which a P-type semiconductor region is provided. These semiconductor regions may correspond to a well. The region 210 is arranged with the two transistors M1 and M2, and the region 220 is arranged with the four transistors M3 to M6.

In the region 210, an element isolation region 211 and an active region 212 are provided on the surface of the semiconductor substrate. In FIG. 2, the transistor M1 is arranged in one active region 212, and the transistor M2 is arranged in another active region 212. However, the transistors M1 and M2 may be arranged in the same active region 212. The transistor M1 has a gate electrode 231 and P-type semiconductor regions 250 and 251 that are the source and the drain. The transistor M2 has a gate electrode 230 and P-type semiconductor regions 252 and 253 that are the source and the drain.

In the region 220, an element isolation region 221 and an active region 222 are provided on the surface of the semiconductor substrate. In FIG. 2, the transistors M3 and M5 are arranged in one active region 222, and the transistors M4 and M6 are arranged in another active region 222. However, the transistors M3 to M6 may be arranged in the same active region 222. The transistor M3 has the gate electrode 231 and N-type semiconductor regions 254 and 255 that are the source and the drain. The transistor M4 has the gate electrode 230 and N-type semiconductor regions 256 and 257 that are the source and the drain. The transistor M5 has a gate electrode 232 and N-type semiconductor regions 255 and 258 that are the source and the drain. The transistor M6 has the gate electrode 232 and N-type semiconductor regions 256 and 259 that are the source and the drain. Here, the gate electrode 232 functions as the gate electrodes of the transistors M5 and M6 and may function as the word line WL in FIG. 1. Here, the example of FIG. 2 lists ACT denoting an active region, GATE denoting a gate electrode, FIELD denoting an element isolation region, and CNT denoting a location of a contact plug.

The gate electrodes 230, 231, and 232 are formed of polysilicon, for example, and may function as a gate electrode of a transistor in a portion overlapping with the active regions 212 and 222. Here, the gate electrode 231 is arranged commonly to the two transistors M1 and M3, the gate electrode 230 is arranged commonly to the two transistors M2 and M4, and the gate electrode 232 is arranged commonly to the two transistors M5 and M6. The gate electrodes 230 and 231 extend from the element isolation region 211 to the active region 212, the element isolation region 211, the element isolation region 221, the active region 222, and the element isolation region 221. The source or the drain other than the gate electrodes may also be formed of a single semiconductor region when the source or the drain of each transistor form a common node.

Here, increased integration of unit cells of the SRAM will be described. The unit cells are arranged repeatedly in the SRAM. By reducing the area of the unit cell as much as possible, higher integration of the SRAM can be achieved. To reduce the area of the unit cell, it is effective to reduce the size of a transistor forming the unit cell. To stabilize the operation as the SRAM, however, a current ratio of respective transistors is to be set to a desirable value, and therefore all the transistors forming the unit cell cannot be formed in the minimum size. If all the transistors forming the unit cell were formed in the minimum size, the current ratio would change, and thereby reduction in a writing or reading operation rate or an operation failure may occur. Out of the transistors forming the unit cell, by designing the size of the load transistor to be the smallest, the size of other transistors can also be reduced, and a desired current ratio is achieved resulting in a stable operation. That is, controlling a channel width defining the size of the load transistor to the minimum value is an effective way to reduce the area of the unit cell. Here, the width of the channel of a transistor is generally defined as a width of an active region between element isolation portions. A space used for element isolation is thus defined in accordance with rules of a semiconductor process. Accordingly, in the present embodiment, a semiconductor region having the conductivity opposite to the polarity of the load transistor is provided at the periphery of an element isolation portion in which the load transistor is provided. By providing such a semiconductor region, an effective channel width of a transistor can be smaller than the space of an element isolation portion. Therefore, design values of the channel widths of the drive transistor and the transfer transistor can be relatively smaller than in a case where the channel width of the load transistor is the minimum value defined by the rules of the process. Thus, the area of the unit cell can be reduced.

Figure 3A:
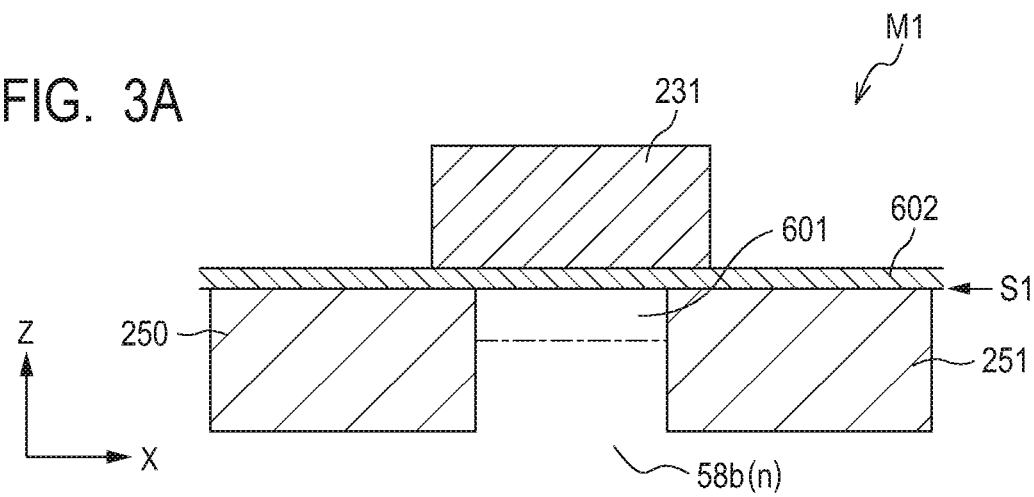
FIG. 3A is a schematic sectional view of a transistor according to the first embodiment.
Figure 3B:
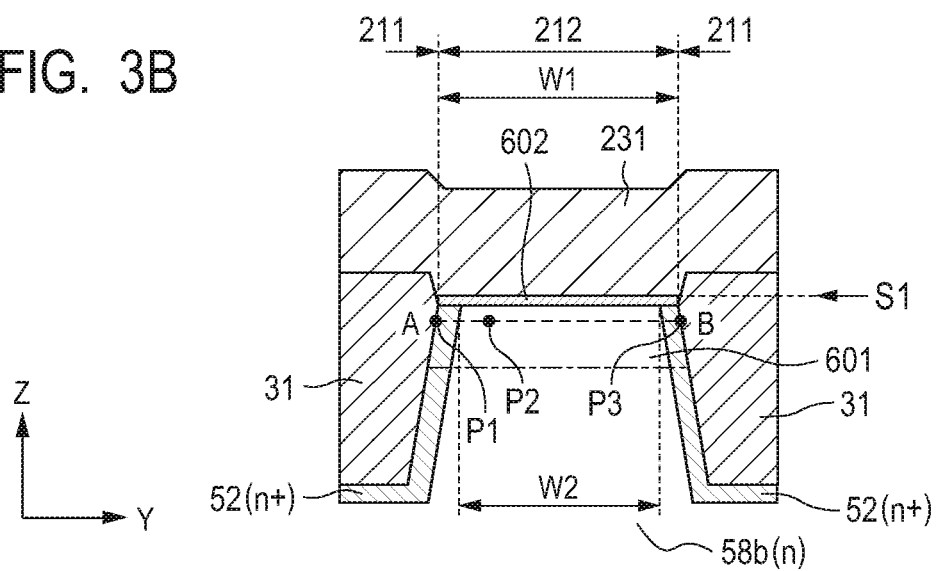
FIG. 3B is a schematic sectional view of the transistor according to the first embodiment.
Figure 3C:
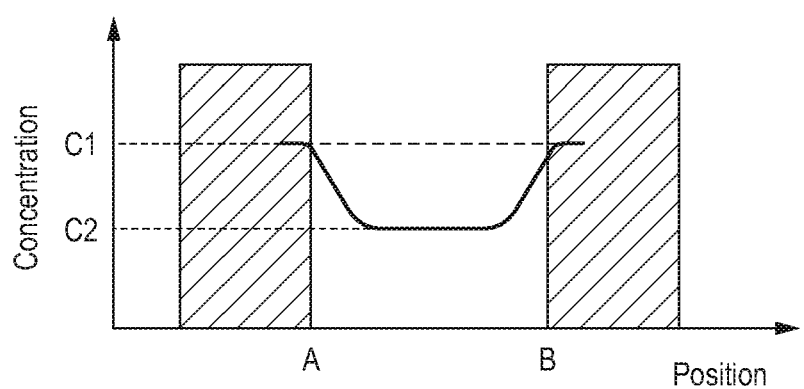
FIG. 3C is a diagram illustrating an impurity concentration of the transistor according to the first embodiment.

Specific configuration of the transistors of the present embodiment will be described by using FIG. 3A to FIG. 3C. FIG. 3A and FIG. 3B are schematic sectional views of the transistor M1 that is the load transistor. FIG. 3A and FIG. 3B are schematic diagrams in which features such as a contact plug are omitted, which are the schematic diagrams in which a portion of transistors is focused on. FIG. 3A illustrates a cross-section of the transistor M1 taken along the X-direction in FIG. 2 and illustrates a cross-section of the transistor M1 in the channel length direction. In FIG. 3A, the semiconductor regions 250 and 251 of the transistor M1 and the gate electrode 231 provided on a gate insulating film 602 are illustrated. The transistor M1 is provided in an N-type semiconductor region 58b. The transistor M1 has a portion 601 located between the semiconductor region 250 and the semiconductor region 251. The portion 601 is a portion in which the gate electrode 231 and the active region 212 overlap with each other in a plan view.

FIG. 3B illustrates a cross-section of the transistor M1 taken along the Y-direction in FIG. 2, which is a cross-section of the transistor M1 in the channel width direction. The active region 212 in which the transistor M1 is arranged between the two element isolation regions 211 is arranged. An element isolation portion 31 is provided to the element isolation region 211. The element isolation portion 31 has a trench isolation structure to which an insulator formed at a groove (trench) is arranged, for example. The trench isolation structure may be Shallow Trench Isolation (STI) structure or Deep Trench Isolation (DTI) structure. In the present embodiment, the element isolation portion 31 is the STI. The gate electrode 231 extends from the element isolation region 211 to the active region 212. The gate electrode 231 extends from the top of the element isolation portion 31 to the top of the gate insulating film 602. Here, the portion 601 is the active region 212 with which the gate electrode 231 is overlapped in the Z-direction. The portion 601 is a region in which a channel of a transistor may be typically formed.

In the present embodiment, an N-type semiconductor region 52 is provided along the side face and the bottom face of a groove of the element isolation portion 31. The N-type semiconductor region 52 has a higher impurity concentration than the N-type semiconductor region 58b. In FIG. 3B, the semiconductor region 52 is denoted with n+, and the semiconductor region 58b is denoted with n. Due to the N-type semiconductor region 52, the channel width that may be actually formed, that is, the effective channel width of the transistor M1 is reduced. When the width between the element isolation regions 31, that is, the width of the portion 601 is a width W1, the effective channel width is W2. It can also be said that the effective channel width is defined by the semiconductor region 52. For example, when the width W1 is larger than or equal to 80 nm and smaller than or equal to 120 nm, the width W2 can be larger than or equal to 60 nm and smaller than or equal to 100 nm, for example. The width W2 is not limited to these values and can be appropriately set in accordance with the semiconductor region 52.

A line section AB in FIG. 3B is a line section along the gate width direction and is located at the ends of the portions 601. The line section AB has a position P1, a position P2, and a position P3 on the line section. The position P2 is a position between the position P1 and the position P3. The semiconductor regions 52 are provided to the position P1 and the position P3, and the semiconductor region 58b is provided to the position P2. FIG. 3C is a diagram illustrating the impurity concentration of the N-type semiconductor regions in the line section AB in FIG. 3B. Here, the impurity concentration refers to a NET concentration. While it is assumed that the position P1 and the position A are the same position and the position P3 and the position B are the same position in FIG. 3B, the positions P1 to P3 are present between the position A and the position B in an actual implementation. The concentration at the position P1 is denoted as C1, the concentration at the position P2 is denoted as C2, and the concentration at the position P3 is denoted as C3. At this time, C1=C3>C2 is obtained. That is, it can be seen that the impurity concentration increases from the center part of the portion 601 toward the boundary between the element isolation portion 31 and the portion 601.

With such a configuration, when the gate electrode 231 is controlled to an on-state, the channel is formed at the position P2, and no channel is formed at the position P1 or the position P3. That is, the threshold of the transistor at the position P1 or the position P3 is higher than that of the position P2. Therefore, the effective channel width of the transistor is reduced with respect to the space between the element isolation portions. With such an impurity concentration profile, the effective channel width can be formed smaller than the space between the element isolation portions 31.

In the present embodiment, while the concentration C1 and the concentration C3 are the same concentration, concentrations different from each other may be used. Further, in the present embodiment, the concentration C1 and the concentration C3 are to be twice or more the concentration C2. The concentration C1 and the concentration C3 are more 10 times or more the concentration C2. With such a concentration relationship, the effective channel width is ensured to be reduced in an operation voltage range.

Note that, in the present embodiment, while it has been described that the semiconductor region 58b in the portion 601 is the N-type, a P-type may also be used as long as the transistor M1 is configured to operate. That is, out of the impurity concentrations of the positions P1, P2, and P3, donor concentrations are D1, D2, and D3, and acceptor concentrations are A1, A2, and A3, respectively. Here, the concentrations D1, D2, D3, A1, A2, and A3 each have a value larger than or equal to zero. At this time, the concentration relationship at each position is D1−A1>D2−A2, and D3−A3>D2 A2.

Further, the position P1 is between the side face of the trench of the element isolation portion 31 and the position P2 and can also be said to be adjacent to the element isolation portion 31. The position P3 is between the side face of the trench of the element isolation portion 31 and the position P2 and can also be said to be adjacent to the element isolation portion 31. In the present embodiment, at the depth of the line section AB, the semiconductor region 52 extends from the side face of the trench to a position of 20 nm, for example.

While being applied to the load transistor of the SRAM-type semiconductor memory, the present embodiment may be applied to other transistors in accordance with the characteristics. By applying a transistor having such a configuration to an SRAM-type semiconductor memory, it is possible to reduce of the size of the unit cell.

Second Embodiment

In the present embodiment, a photoelectric conversion device 300 using the semiconductor memory of the first embodiment will be described. In the photoelectric conversion device of the present embodiment, an SRAM and a photoelectric conversion unit having a photoelectric conversion element are arranged on the same semiconductor substrate. Here, the photoelectric conversion unit may be a CCD sensor, a CMOS sensor, or the like. The photoelectric conversion unit of the present embodiment is a CMOS sensor having a photodiode that is a photoelectric conversion element, a transfer transistor, and an amplification transistor.

A manufacturing method of the photoelectric conversion device of the present embodiment will be described by using FIG. 4A to FIG. 6B. FIG. 4A to FIG. 6B are schematic sectional views illustrating the manufacturing method of the photoelectric conversion device 300. A region 310 is a region in which the SRAM is formed and includes the regions 210 and 220 described in the first embodiment. A region 330 is a region in which a pixel of the photoelectric conversion unit is arranged. The pixel includes at least a photodiode and a transfer transistor. A processing circuit unit including a circuit for operating a pixel or a circuit for signal processing is arranged in a region 340. The processing circuit unit includes a logic circuit or the like, for example, and is also referred to as a peripheral circuit in an imaging device. The region 340 has a region 350 and a region 360. The region 350 represents a region in which an N-type transistor is arranged, and the region 360 represents a region in which a P-type transistor is arranged.

A process illustrated in FIG. 4A will be described. First, a substrate 30 is prepared. The substrate 30 is a single-crystal substrate of silicon, for example, and may be a processed substrate. The substrate 30 has the region 310, the region 330, and the region 340. Next, a mask pattern 32 is formed on the substrate 30. The mask pattern 32 is a mask pattern used for forming a groove to be an element isolation portion. The mask pattern 32 has openings provided at any positions in the region 220, the region 210, the region 330, and the region 340, respectively. The openings of the mask pattern 32 expose portions in which grooves are to be formed later on the surface S1 of the substrate 30. Then, by etching the substrate 30 by using the mask pattern 32 as a mask, grooves 31a to 31d corresponding to respective openings are formed. The groove 31a is provided in the region 220, the groove 31b is provided in the region 210, the groove 31c is provided in the region 330, and the groove 31d is provided in the region 340. Here, the mask pattern 32 is formed of, for example, an inorganic material such as a silicon nitride film, a silicon oxide film, or the like. The mask pattern 32 can be formed by forming an inorganic material film on the substrate 30, forming a pattern made of an organic material on the inorganic material film, and removing a part of the inorganic material film by etching by using the pattern as a mask. In the present embodiment, a silicon nitride film is used as an inorganic material. The pattern made of an organic material may be a photoresist pattern, for example.

Figure 4A:
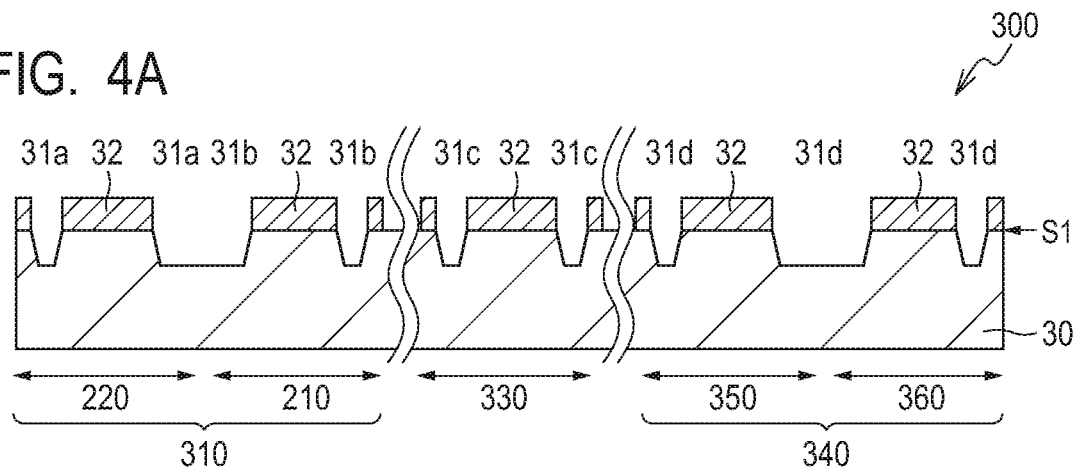
FIG. 4A is a schematic sectional view illustrating a manufacturing method of a photoelectric conversion device according to a second embodiment.
Figure 4B:
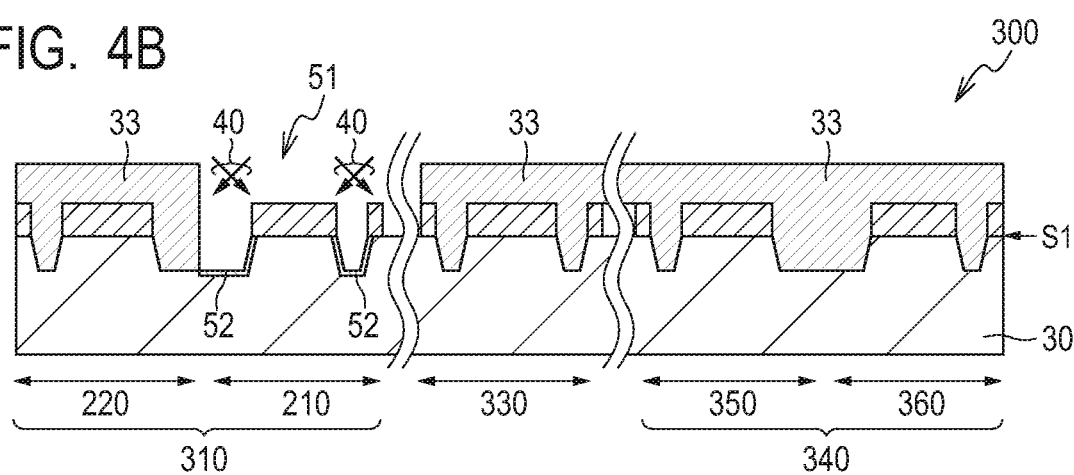
FIG. 4B is another schematic sectional view illustrating the manufacturing method of the photoelectric conversion device according to the second embodiment.

In FIG. 4B, a mask pattern 33 is formed on the mask pattern 32. The mask pattern 33 is a mask pattern used for forming an N-type semiconductor region on the side face and the bottom face of the groove of the region 210. The mask pattern 33 covers the regions 220, 330, and 340 and exposes the region 210. That is, the mask pattern 33 covers the grooves 31a, 31c, and 31d and exposes the groove 31b. The mask pattern 33 has an opening 51 that exposes the region 210. The opening 51 may expose at least the groove 31b of the region 210. Here, as described in the first embodiment, the region 210 is a portion in which the load transistor of the SRAM is formed and a region in which a P-type transistor is formed. The mask pattern 33 is formed of a photoresist. The mask pattern 33 is formed by performing exposure, development, or the like after forming a film made of a photoresist on the mask pattern 32. Ion implantation 40 is then performed on the substrate 30 by using the mask pattern 32 and the mask pattern 33 as a mask. The N-type semiconductor region 52 is formed along the side face and the bottom face of the trench by the ion implantation 40. Ion species of the ion implantation 40 are impurity ions used for forming an N-type semiconductor region such as phosphorus (P), arsenic (As), or the like, for example. Any implantation angle for the ion implantation 40 may be selected. In the present embodiment, the ion implantation is applied obliquely to the surface S1 of the substrate 30, and it is to select the ion implantation angle of around 10 degrees. Here, the ion implantation angle is an angle formed between the perpendicular line of the surface S1 and the direction of the ion implantation. With such an implantation angle, ions can be effectively implanted even on the side face of a trench. Further, by performing the ion implantation 40 with rotation of 360 degrees in the direction on the surface S1, the ion implantation can be performed on the entire side face of a trench. Subsequently, the mask pattern 32 is left, and the mask pattern 33 is removed (not illustrated).

Figure 4C:
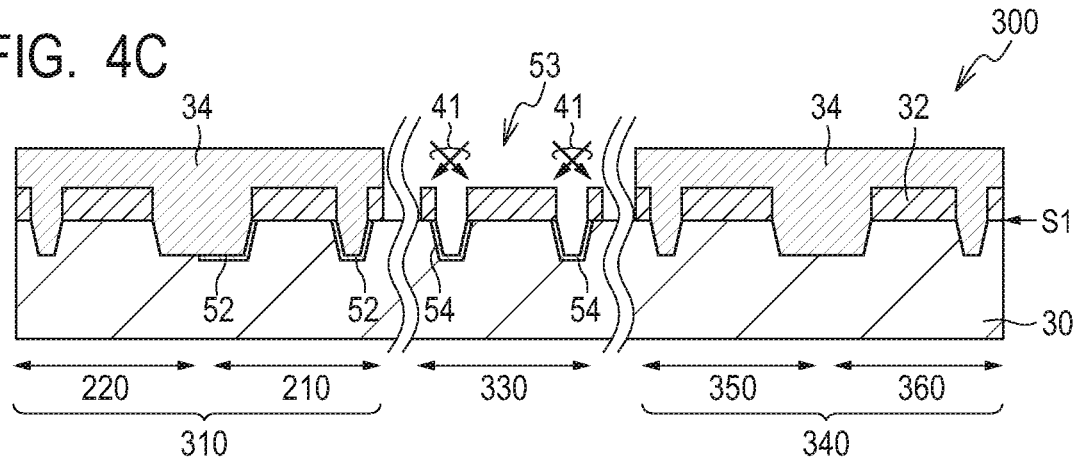
FIG. 4C is yet another schematic sectional view illustrating the manufacturing method of the photoelectric conversion device according to the second embodiment.

In FIG. 4C, a mask pattern 34 is formed on the mask pattern 32. The mask pattern 34 is a mask pattern used for forming a P-type semiconductor region on the side face and the bottom face of the groove of the region 330. The mask pattern 34 covers the regions 210, 220, and 340 and exposes the region 330. That is, the mask pattern 34 covers the grooves 31a, 31b, and 31d and exposes the groove 31c. The mask pattern 34 has an opening 53 that exposes the region 330. The opening 53 may expose at least the groove 31c of the region 330. The mask pattern 34 is formed of a photoresist. The mask pattern 34 is formed by performing exposure, development, or the like after forming a film made of a photoresist on the mask pattern 32. Ion implantation 41 is then performed on the substrate 30 by using the mask pattern 32 and the mask pattern 34 as a mask. The P-type semiconductor region 54 is formed along the side face and the bottom face of the trench by the ion implantation 41. Ion species of the ion implantation 41 are impurity ions used for forming a P-type semiconductor region such as boron (B), boron fluoride ($BF_2$), or the like, for example. Any implantation angle for the ion implantation 41 may be selected, and it is to select the angle of around 10 degrees with respect to the surface S1 of the substrate 30. With such an implantation angle, ions can be effectively implanted even on the side face of a trench. Further, by performing the ion implantation 41 with rotation of 360 degrees in the direction on the surface S1, the ion implantation can be performed on the entire side face of a trench.

Subsequently, the mask pattern 32 is left, and the mask pattern 34 is removed. The mask pattern 32 is then removed, and an insulator is embedded to the groove 31a to the groove 31d to form an element isolation portion. The insulator may be, for example, silicon oxide or silicon nitride. First, the mask pattern 34 is removed, and a heating process is then performed to reduce damage occurring at the grooves before a film of an insulator is formed, for example. At this time, a film caused by thermal oxidation may be formed on the inner wall of the groove. The element isolation portion 31 is formed by forming a film of an insulator so as to cover the groove 31a to the groove 31d by using a high-density plasma CVD method or the like and removing an excessive insulator film by using a polishing technology such as etching, a CMP method, or the like. The element isolation portion 31 in which the semiconductor region 52 is formed on the periphery is formed in the region 210, and the element isolation portion 31 in which the semiconductor region 54 is formed on the periphery is formed in the region 330. Neither the semiconductor regions 52 nor 54 is formed on the periphery of the element isolation portions 31 in the region 220 and the region 340. Further, a film of silicon oxide is formed on the surface S1 for a subsequent process (not illustrated).

Figure 5A:
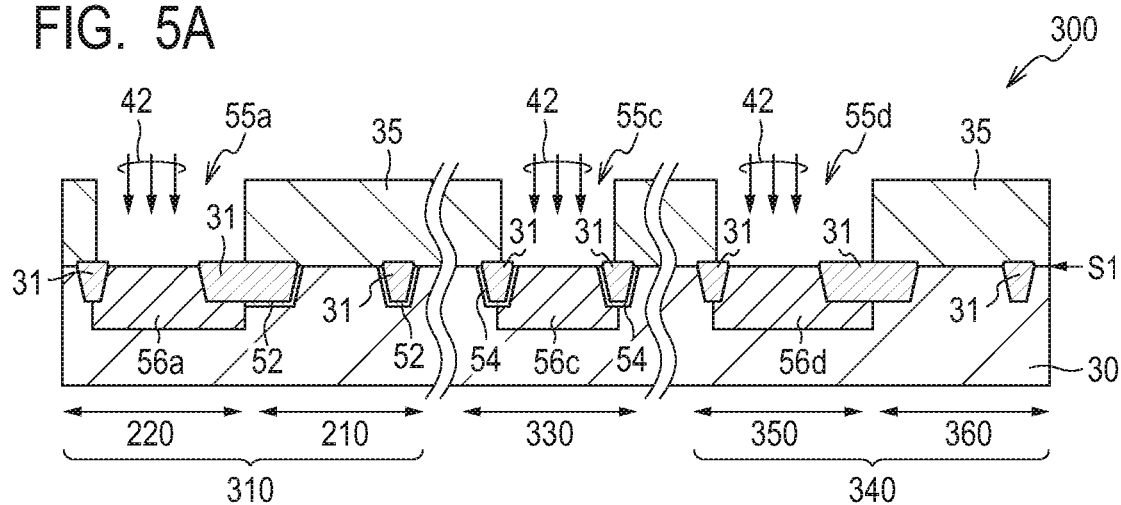
FIG. 5A is a schematic sectional view illustrating the manufacturing method of the photoelectric conversion device according to the second embodiment.

In FIG. 5A, a mask pattern 35 is formed on the surface S1 of the substrate 30. The mask pattern 35 is a mask pattern used for forming P-type semiconductor regions in the region 220, the region 330, and the region 350. These P-type semiconductor regions may function as a well in which an element is formed, for example. The mask pattern 35 covers the regions 210 and the region 360 and exposes the region 320, the region 330, and the region 350. That is, the mask pattern 35 has openings 55a, 55c, and 55d that expose the region 320, the region 330, and the region 350. The mask pattern 35 is formed of a photoresist and formed in the same manner as other mask patterns. Ion implantation 42 is then performed on the substrate 30 by using the mask pattern 35 as a mask. A P-type semiconductor regions 56a, 56c, and 56d are formed by the ion implantation 42. Ion species of the ion implantation 42 are the same as those of the ion implantation 41. Any implantation angle for the ion implantation 42 may be selected. Note that, since the region 330 is a region in which a photoelectric conversion element is formed, in order to form the well suitable for the photoelectric conversion element, additional ion implantation may be performed, or the region 330 may be formed in a different process from the process for the regions 220 and 340. Subsequently, the mask pattern 35 is removed (not illustrated).

Figure 5B:
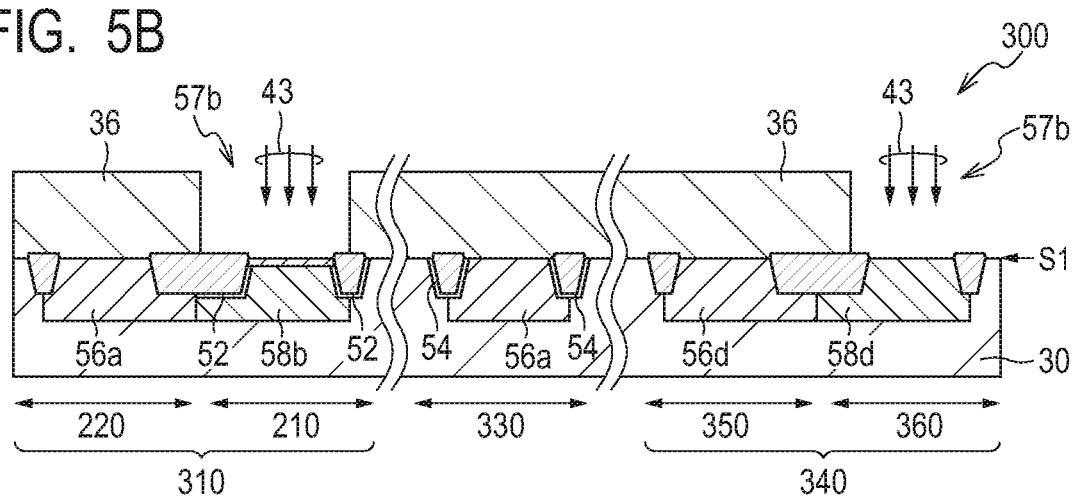
FIG. 5B is another schematic sectional view illustrating the manufacturing method of the photoelectric conversion device according to the second embodiment.

In FIG. 5B, a mask pattern 36 is formed on the surface S1 of the substrate 30. The mask pattern 36 is a mask pattern used for forming N-type semiconductor regions in the region 210 and the region 360. The N-type semiconductor regions may function as a well in which an element is formed, for example. The mask pattern 36 covers the regions 220, the region 330, and the region 350 and exposes the region 210 and the region 360. The mask pattern 36 has openings 57b and 57d that expose the region 210 and the region 360. The mask pattern 36 is formed of a photoresist and formed in the same manner as other mask patterns. Ion implantation 43 is then performed on the substrate 30 by using the mask pattern 36 as a mask. N-type semiconductor regions 58b and 58d are formed by the ion implantation 43. Ion species of the ion implantation 43 are the same as those of the ion implantation 40. Any implantation angle for the ion implantation 43 may be selected. Subsequently, the mask pattern 36 is removed (not illustrated).

Figure 5C:
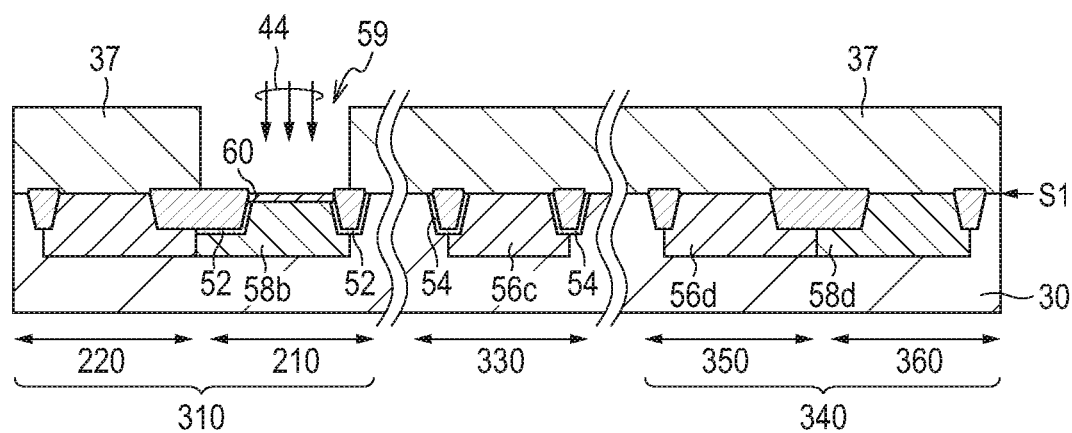
FIG. 5C is yet another schematic sectional view illustrating the manufacturing method of the photoelectric conversion device according to the second embodiment.

In FIG. 5C, a mask pattern 37 is formed on the surface S1 of the substrate 30. The mask pattern 37 is a mask pattern used for forming a P-type semiconductor region 60 in the region 210. The P-type semiconductor region 60 may be provided for adjusting the threshold of the transistor. The mask pattern 37 covers the regions 220, the region 330, and the region 340 and exposes the region 210. The mask pattern 37 has an opening 59 that exposes the region 210. The mask pattern 37 is formed of a photoresist and formed in the same manner as other mask patterns. Ion implantation 44 is then performed on the substrate 30 by using the mask pattern 37 as a mask. The P-type semiconductor region 60 is formed by the ion implantation 44. Ion species of the ion implantation 44 are the same as those of the ion implantation 41. Any implantation angle for the ion implantation 44 may be selected. Subsequently, the mask pattern 37 is removed (not illustrated).

Figure 6A:
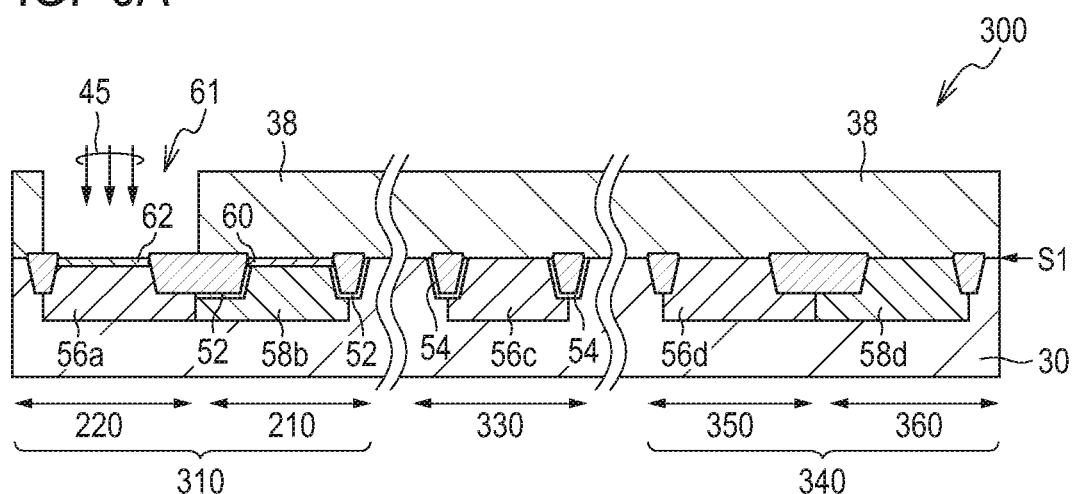
FIG. 6A is a schematic sectional view illustrating the manufacturing method of the photoelectric conversion device according to the second embodiment.

In FIG. 6A, a mask pattern 38 is formed on the surface S1 of the substrate 30. The mask pattern 38 is a mask pattern used for forming an N-type semiconductor region 62 in the region 220. The N-type semiconductor region 62 may be provided for adjusting the threshold of the transistor. The mask pattern 38 covers the regions 210, the region 330, and the region 340 and exposes the region 220. The mask pattern 38 has an opening 61 that exposes the region 220. The mask pattern 38 is formed of a photoresist and formed in the same manner as other mask patterns. Ion implantation 45 is then performed on the substrate 30 by using the mask pattern 38 as a mask. The N-type semiconductor regions 62 is formed by the ion implantation 45. Ion species of the ion implantation 45 are the same as those of the ion implantation 40. Any implantation angle for the ion implantation 45 may be selected. Subsequently, the mask pattern 38 is removed (not illustrated).

Here, in general, a circuit formed in the region 340 uses a transistor having a low threshold to increase the operation speed. On the other hand, a circuit formed in the region 310 or an SRAM uses a transistor having a relatively high threshold to stabilize the circuit operation. Accordingly, in the present embodiment, addition of the processes illustrated in FIG. 5C and FIG. 6A makes it possible to make the transistors in the region 310 and the region 340 in a single process. With such a manufacturing method, it is possible to manufacture a photoelectric conversion device at low cost. Note that, the process illustrated in FIG. 5C or FIG. 6A may be applied to the transistor in the region 330 or the region 340.

Figure 6B:
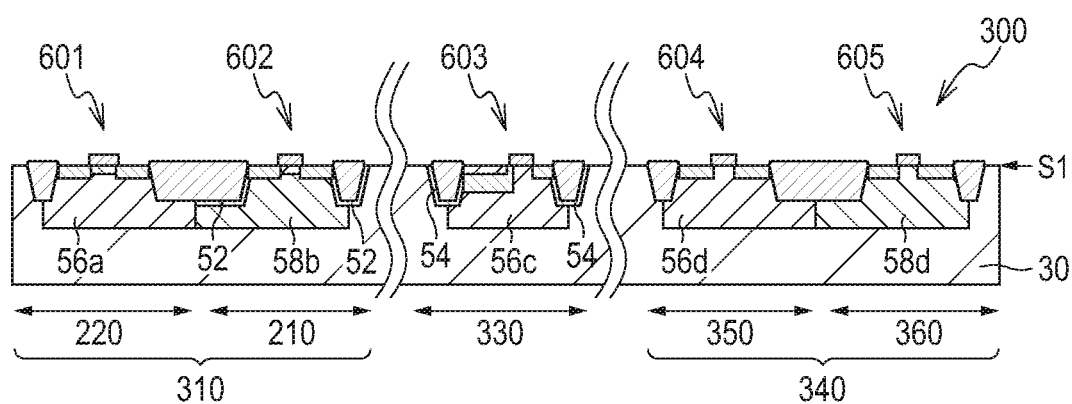
FIG. 6B is another schematic sectional view illustrating the manufacturing method of the photoelectric conversion device according to the second embodiment.

FIG. 6B illustrates a state where an element is formed after the process described in FIG. 6A. A P-type transistor is formed in the region 210, an N-type transistor is formed in the region 220, an N-type transistor, a photoelectric conversion element, or the like is formed in the region 330, and an N-type transistor and a P-type transistor are formed in the region 340. The transistors or the photoelectric conversion element can be formed by formation of a gate electrode or ion implantation. Then, a photoelectric conversion device is formed by forming an interlayer insulating film, a contact plug, or a wiring layer and forming a color filter, a microlens, or the like. Note that, for a photoelectric conversion device of a backside illumination type, thinning of the substrate 30, forming an element isolation on the backside, or the like may be performed. As described above, a photoelectric conversion device is formed in the processes illustrated in FIG. 4A to FIG. 6B.

Here, the condition of ion implantation in accordance with the characteristics of the transistor of the region 210 will be described. The characteristics of the transistor are significantly affected by the ion implantation 40 and the ion implantation 44. Here, a dose of the ion implantation 40 is larger than a dose of the ion implantation 44. This is because the impurity concentration relationship described above is satisfied. With such a manufacturing method, no channel is formed in the semiconductor region 52 located under the gate electrode of the transistor, and thereby the effective channel width of the transistor can be reduced.

Note that, the mask pattern 32 illustrated in FIG. 4A may be formed of a photoresist. In such a case, ultraviolet irradiation is performed on the mask pattern 32 formed of a photoresist to cure the photoresist, for example. By forming the mask pattern 32 formed of a photoresist in such a way, it is possible to remove the mask pattern 33 in the process of FIG. 4B while leaving the mask pattern 32. Note that, by forming the mask pattern 32 of a photoresist, time for dry etching or the like to remove the mask pattern 32 can be reduced compared to a case where the mask pattern 32 is formed of an inorganic material.

Third Embodiment

Figure 7:
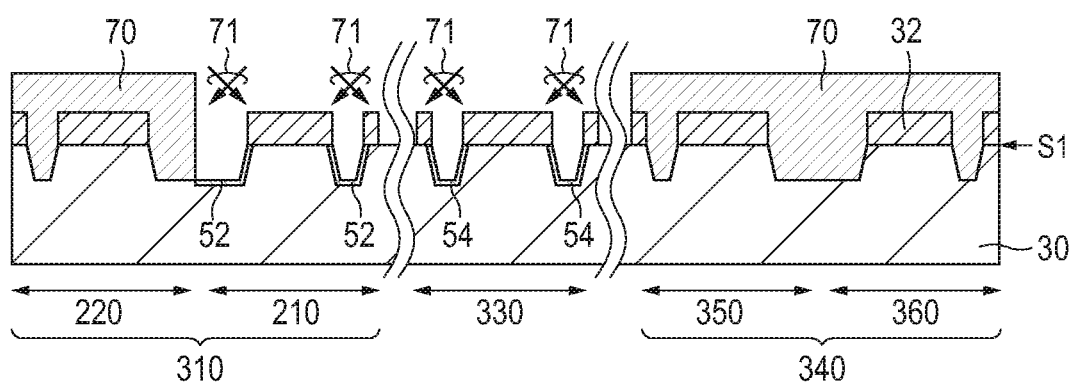
FIG. 7 is a schematic sectional view illustrating a manufacturing method of a photoelectric conversion device according to a third embodiment.

In the present embodiment, a modified example of the photoelectric conversion device 300 using the semiconductor memory of the second embodiment will be described by using FIG. 7. FIG. 7 is a schematic sectional view illustrating a manufacturing method of a photoelectric conversion device of the present embodiment.

In the present embodiment, the polarity of the photoelectric conversion element of the second embodiment is changed. That is, the semiconductor region 54 in FIG. 6B is an N-type semiconductor region that is the same polarity as the semiconductor region 52. With such a configuration, as illustrated in FIG. 7, the processes of forming the semiconductor region 52 and the semiconductor region 54 can be performed in a single process. The processes of forming include a process of a mask pattern formation or a process of ion implantation. According to the present embodiment, a photoelectric conversion device having an SRAM can be formed by using fewer processes.

Fourth Embodiment

Figure 8:
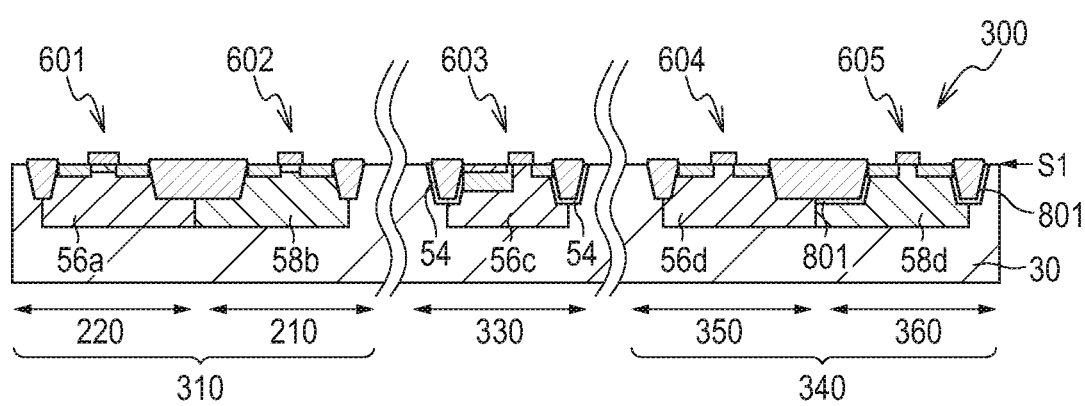
FIG. 8 is a schematic sectional view illustrating a photoelectric conversion device according to a fourth embodiment.

In the present embodiment, a modified example of the photoelectric conversion device 300 using the semiconductor memory of the second embodiment will be described. FIG. 8 is a schematic sectional view of a photoelectric conversion device of the present embodiment. In the present embodiment, an N-type semiconductor region 801 is provided to a transistor in the region 360. The semiconductor region 801 has the same function as the semiconductor region 52 of the second embodiment. Such a configuration can provide a finer transistor. Further, the present transistor configuration reduces noise such as Random Telegraph Noise (hereinafter, referred to as RTN) or the like due to a channel of a transistor. The present embodiment can be applied to a CMOS circuit that is a circuit in which the RTN is to be considered in addition to the photoelectric conversion device.

Fifth Embodiment

In the present embodiment, a photoelectric conversion device to which transistors are applied will be described. Before the description of the photoelectric conversion device, a transistor with reduced noise will be described in detail by using FIG. 3A to FIG. 3C and FIG. 9A to FIG. 9B.

Figure 9A:
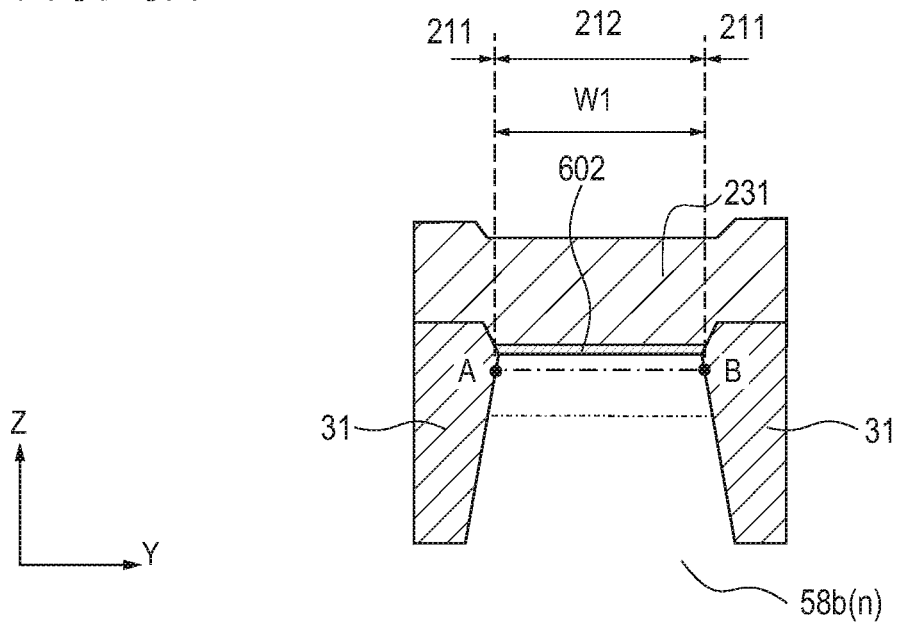
FIG. 9A is a schematic sectional view of a transistor according to a fifth embodiment.
Figure 9B:
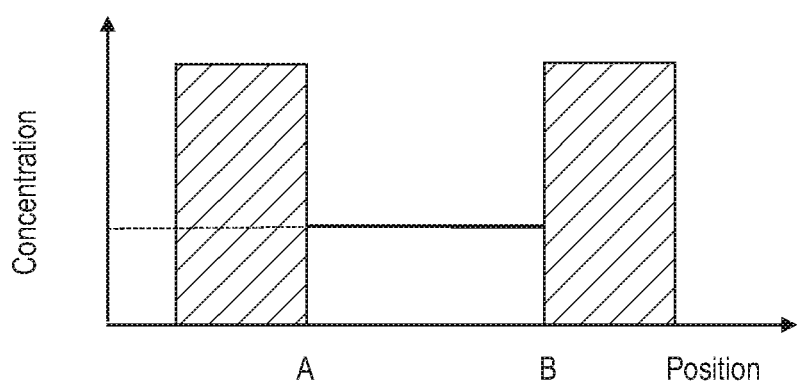
FIG. 9B is a diagram illustrating an impurity concentration of the transistor according to the fifth embodiment.

FIG. 9A and FIG. 9B are schematic diagrams illustrating an example of a case without the semiconductor region 52 illustrated in FIG. 3B. FIG. 9A is a schematic sectional view of a transistor in accordance with FIG. 3B. FIG. 9B corresponds to FIG. 3C and is a diagram illustrating the impurity concentration of an N-type semiconductor region in the line segment AB in FIG. 9A. In FIG. 9A and FIG. 9B, the same components as those of FIG. 3A to FIG. 3C are labeled with the same reference, and the description thereof will be omitted. A transistor in a comparative example illustrated in FIG. 9A does not have the semiconductor region 52 illustrated in FIG. 3B. Thus, the impurity concentration in the line segment AB in FIG. 9A illustrated in FIG. 9B is constant at the concentration C2. The difference between the maximum and the minimum of the impurity concentration change of the P-type semiconductor region 58b in the line segment AB in FIG. 9A is smaller than the difference between the maximum and the minimum of the impurity concentration change of the P-type semiconductor region in the line segment AB in FIG. 3B. The difference between the maximum and the minimum of the impurity concentration change of the P-type semiconductor region in the line segment AB in FIG. 3B can be said as the impurity concentration difference between the semiconductor region 52 and the semiconductor region 58b. Here, the effective channel width of a transistor of the comparative example is defined as a width W3. While the effective channel width of the transistor described in FIG. 3A and FIG. 3B is the width W2, the effective channel width of the transistor of the comparative example is the width W3. The width relationship is W3=W1>W2. In the description below, the transistor illustrated in FIG. 3A and FIG. 3B is denoted as a first-type transistor, and the transistor illustrated in FIG. 9A is denoted as a second-type transistor.

An inverse narrow channel effect may occur in a transistor arranged adjacent to the element isolation portion 31 of the STI structure. The inverse narrow channel effect means an operation of a transistor described below. The channel end along the channel width direction of the transistor is adjacent to the STI structure. An electric field generated by the gate electrode is concentrated at this channel end. As a result, the threshold of the transistor is reduced at the channel end. Here, when the transistor is driven, the drain current flows. That is, in the configuration in FIG. 9A, the drain current is concentrated at the channel end having a low threshold. Further, oxygen deficiency is generated inside the semiconductor substrate near the element isolation portion 31. In the region having oxygen deficiency, the phenomenon of trapping or emitting of electrons serving as carriers may frequently occur. When a drain current is concentrated at the channel end, that is, near the element isolation portion 31, the value of RTN increases, that is, deteriorates. That is, depending on the position at which the second-type transistor illustrated in FIG. 9A is used, the RTN is superimposed on a signal. In a case of a photoelectric conversion device, such a situation may cause deterioration of the image quality, such as deterioration in which a liner flaw appears in an image due to noise, for example. The first-type transistor has the improved RTN characteristics compared to the second-type transistor, and the second-type transistor can be manufactured in a smaller number of processes than the first-type transistor and can improve drive force because the effective channel length is long. Next, the arrangement of transistors in a photoelectric conversion device will be described.

Figure 10:
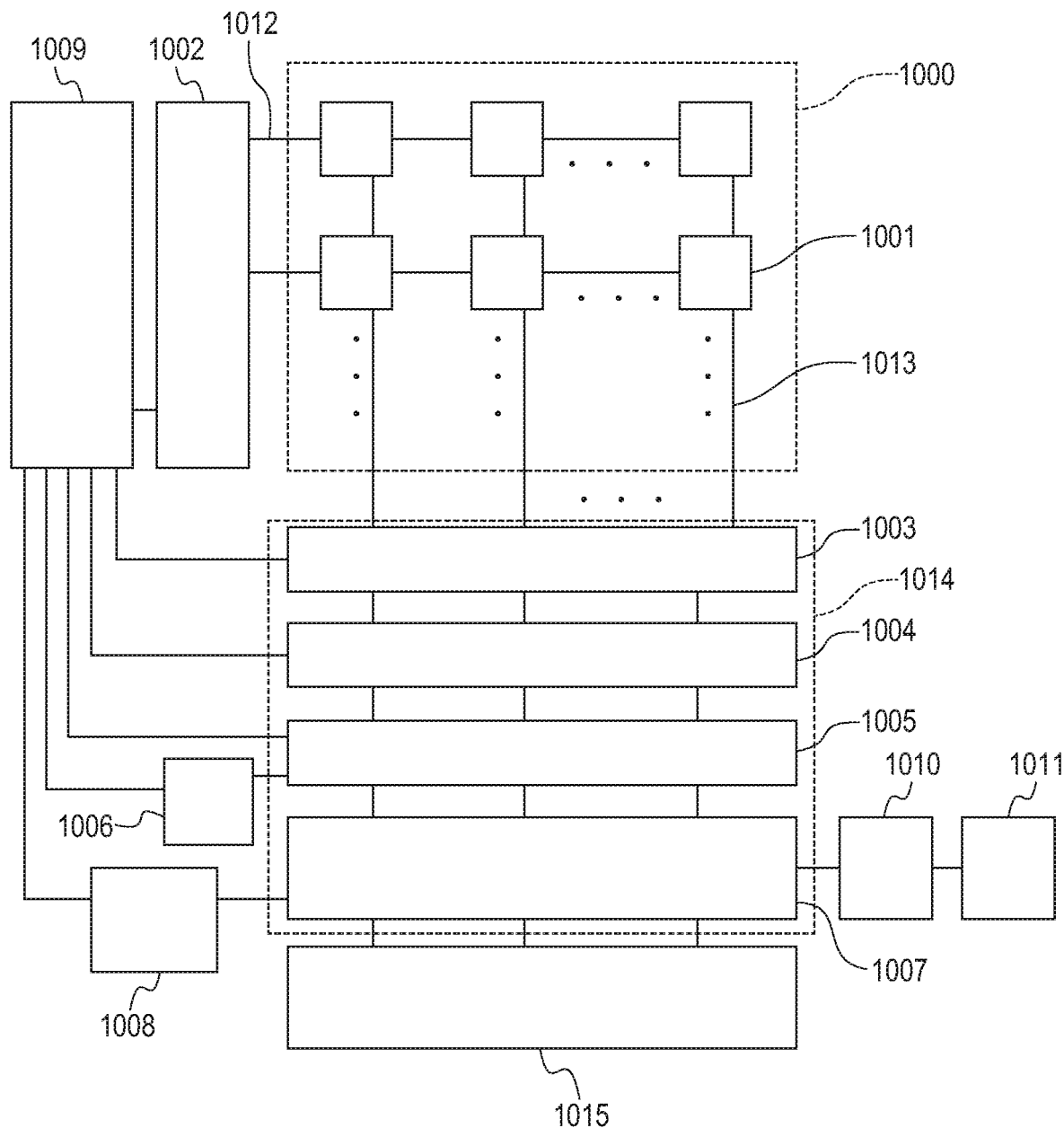
FIG. 10 is a block diagram illustrating a configuration of a photoelectric conversion device.

FIG. 10 is a block diagram illustrating a configuration of a photoelectric conversion device. A unit cell portion 1000 has a plurality of unit cells 1001. The unit cells 1001 are two-dimensionally arranged. The unit cell 1001 may be referred to as a pixel in a photoelectric conversion device. The unit cell 1001 has a pixel configuration of a CMOS-type photoelectric conversion device, for example. A vertical scanning circuit 1002 outputs a control signal used for driving each unit cell 1001. A control line 1012 electrically connects the vertical scanning circuit 1002 to each unit cell 1001 and supplies control signals to the element of each unit cell 1001. While a single control line 1012 is arranged to a plurality of unit cells 1001 arranged on each row in FIG. 10, a plurality of control lines 1012 are arranged on each row in the actual implementation. A plurality of lines refer to the number of lines used to control the unit cells 1001. Signals from the unit cells 1001 are output to a signal line 1013. At least one signal line 1013 is electrically connected to a plurality of unit cells 1001 arranged on each column. The signal line 1013 is electrically connected to a signal readout unit 1014.

The signal readout unit 1014 has a current source circuit 1003, a signal amplifier circuit 1004, an analog-to-digital (AD) converter circuit 1005, and a memory circuit 1007. The current source circuit 1003 supplies a constant current used for reading out a signal of the unit cell 1001 to the signal line 1013. The signal line 1013 is electrically connected to the signal amplifier circuit 1004. The signal amplifier circuit 1004 amplifies a signal input from the signal line 1013. The AD converter circuit 1005 converts an analog signal from the signal amplifier circuit 1004 to a digital signal. A ramp generation circuit 1006 generates a reference signal to be compared with a signal on which AD conversion is performed in the AD converter circuit 1005. A counter circuit 1008 outputs a count value. The memory circuit 1007 holds a count value output from the counter circuit 1008. A horizontal scanning circuit 1015 supplies a control signal used for transferring a value held in the memory circuit 1007 to a signal processing circuit 1010. A signal output circuit 1011 outputs a signal processed in the signal processing circuit 1010 to the outside of the photoelectric conversion device. Driving of these circuits is controlled based on control signals from a timing generator (TG) 1009. Note that the circuit such as a signal amplifier circuit 1004, the AD converter circuit 1005, or the like can be appropriately omitted or changed. Here, a portion in which a circuit other than the unit cell portion 1000 is arranged may be referred to as a peripheral circuit portion.

Figure 11:
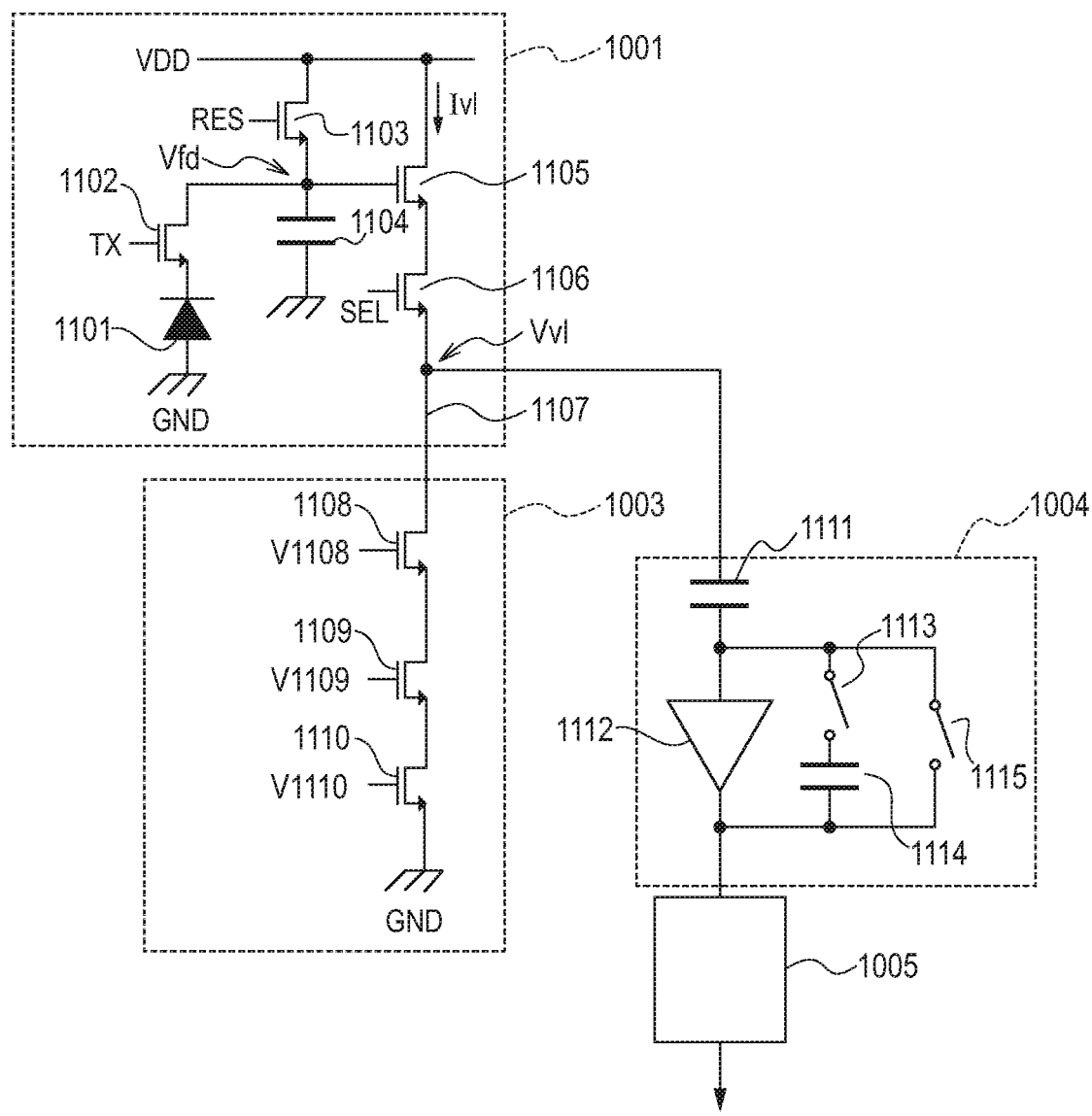
FIG. 11 is an equivalent circuit diagram illustrating a photoelectric conversion device according to the fifth embodiment.

FIG. 11 is an equivalent circuit diagram illustrating a photoelectric conversion device. FIG. 11 illustrates a readout path of the photoelectric conversion device. FIG. 11 illustrates a configuration of the unit cell 1001, the current source circuit 1003, the signal amplifier circuit 1004, and the AD converter circuit 1005 illustrated in FIG. 10. The unit cell 1001 includes a photodiode (hereinafter, referred to as PD) 1101, a transfer transistor 1102, a floating diffusion portion (hereinafter, referred to as FD) 1104, a reset transistor 1103, an amplification transistor 1105, and a select transistor 1106. The PD 1101 functions as a photoelectric conversion unit that photoelectrically converts an incident light received through an optical system. The anode of the PD 1101 is grounded, and the cathode is connected to the source of the transfer transistor 1102. The transfer transistor 1102 is driven by a control signal TX input to the gate and transfers charges generated in the PD 1101 to the FD 1104. The FD 1104 temporarily accumulates charges and functions as a charge-to-voltage converter unit that converts accumulated charges into a voltage signal. The amplification transistor 1105 forms a source follower amplifier together with the current source circuit 1003. An electric signal charge-to-voltage converted in the FD 1104 is input to the gate of the amplification transistor 1105. Further, the drain of the amplification transistor 1105 is connected to a power source voltage VDD, and the source thereof is connected to the select transistor 1106. The reset transistor 1103 electrically connects the FD 1104 to the power source voltage VDD. When the reset transistor 1103 is controlled to an on-state by a control signal RES, charges in the FD 1104 are drained to the power source voltage VDD and reset. Here, the power source voltage VDD may be referred to as a reference voltage. The select transistor 1106 electrically connects the amplification transistor 1105 to a signal line 1107. When a row of interest is selected at a certain time, a control signal SEL is controlled to a high level. The select transistor 1106 to which the control signal SEL at the high level is supplied is controlled to a conduction state, and a signal from the amplification transistor 1105 is output to the signal line 1107. These transistors of the unit cell 1001 are N-type transistors. A constant current is supplied to the signal line 1107, and a source follower amplifier is formed.

The current source circuit 1003 includes three N-type transistors 1108 to 1110. The three transistors 1108 to 1110 are provided between the signal line 1107 and the ground voltage GND so as to be directly connected. The transistor 1109 and the transistor 1110 are cascode-connected and function as a current source. The transistor 1108 functions as a switch used for turning on or off the current source. A control signal V1108 is supplied to the gate of the transistor 1108. In response to the control signal V1108 being at the high level, a constant current is supplied to the signal line 1107, and in response to the control signal V1108 being at a low level, the supply of the constant current to the signal line 1107 stops. A control signal V1109 is supplied to the gate of the transistor 1109, and a control signal V1110 is supplied to the gate of the transistor 1110. The control signal V1109 and the control signal V1110 are fixed bias voltages that determine the operation points of the transistor 1109 and the transistor 1110, respectively.

The output of the source follower amplifier formed of the amplification transistor 1105 is input to the signal amplifier circuit 1004. The signal amplifier circuit 1004 includes an inverting amplifier 1112, an input capacitor 1111, a feedback capacitor 1114, a switch 1113, and a switch 1115. The degree of amplification of a signal can be changed by selecting or deselecting the feedback capacitor 1114 by using the switch 1113 to change the capacitance value. Further, the degree of amplification of a signal may be changed by changing the position of the switch 1113 to change the capacitance value of the input capacitor 1111. The switch 1115 resets the inverting amplifier 1112, the input capacitor 1111, and the feedback capacitor 1114. A signal amplified by the signal amplifier circuit 1004 is AD-converted in the AD converter circuit 1005.

The relationship between a current flowing in the signal line 1107 and a signal will now be described. First, a change amount ΔVvl of a voltage Vvl of the signal line 1107 when a current Ivl flowing in the signal line 1107 changes by ΔIvl is calculated. Where β is a current parameter of the amplification transistor 1105, Vvl and ΔVvl are expressed by Equation (1) and Equation (2).

$$Vvl = Vfd - Vth - \sqrt{2Ivl/\beta} \qquad \text{Equation (1)}$$

$$\Delta Vvl = -\sqrt{2\Delta Ivl/\beta} \qquad \text{Equation (2)}$$

It is understood from Equation (2) that the voltage Vvl changes as the current Ivl of the signal line 1107 changes. That is, the current Ivl causes a change of the voltage Vvl. Here, since an optical signal from the PD 1101 or a reset signal used as a reference appears in the voltage Vvl, the voltage Vvl do not vary because of other factors. If the voltage Vvl varied, the change would be superimposed on a voltage indicating a signal and result in noise. In other words, in one embodiment, the current Ivl be a constant current that varies less. Accordingly, as described by using FIG. 3A to FIG. 3C and FIG. 9A to FIG. 9B, the first-type N-type transistor having a constant drain current be applied to the transistor 1109 and the transistor 1110 that form the current source. With such a configuration, the current ΔIvl and the voltage ΔVvl can be reduced, and deterioration of signals due to RTN can be reduced.

Sixth Embodiment

Figure 12:
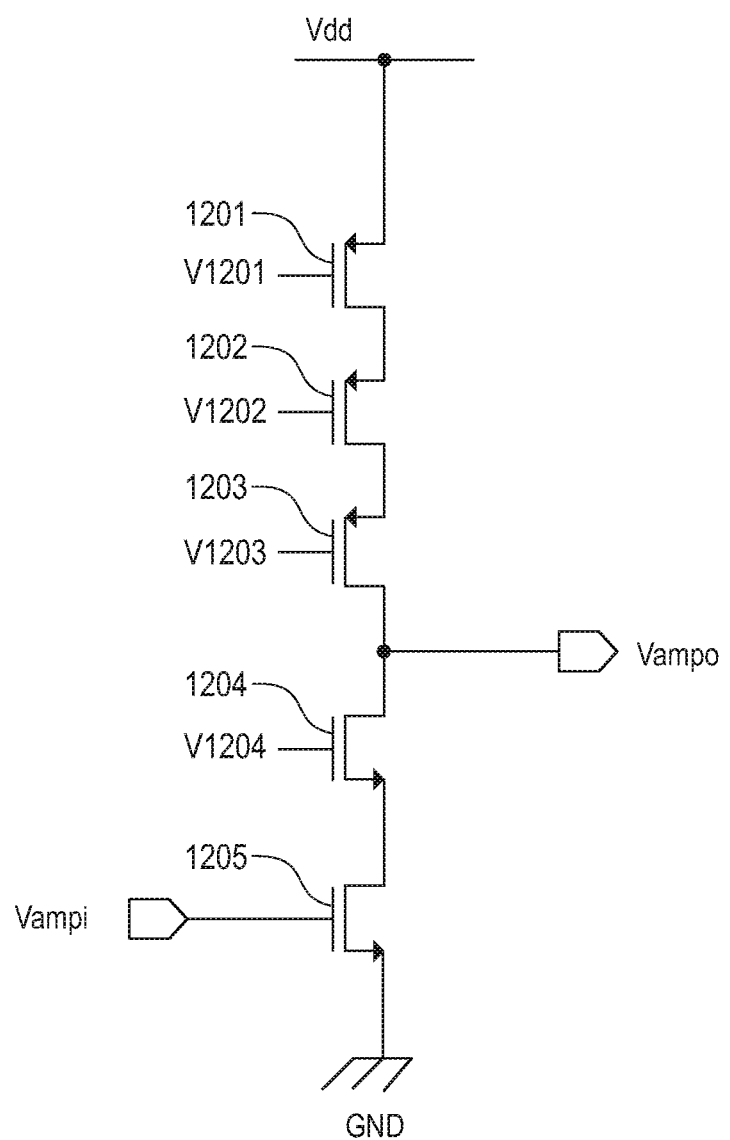
FIG. 12 is an equivalent circuit diagram illustrating a photoelectric conversion device according to a sixth embodiment.

A photoelectric conversion device according to the present embodiment will be described by using FIG. 12. FIG. 12 is an equivalent circuit diagram illustrating the photoelectric conversion device according to the present embodiment. FIG. 12 illustrates the inverting amplifier 1112 of the signal amplifier circuit 1004 illustrated in FIG. 10 or FIG. 11. The inverting amplifier 1112 includes at least five transistors 1201 to 1205. The P-type transistor 1202 and the P-type transistor 1203 are cascode-connected to each other to form a current source circuit. The current source flows a constant current of 6 μA, for example. A control signal V1202 and a control signal V1203 are supplied to the gates of the transistor 1202 and the transistor 1203, respectively, and are fixed bias voltages that determine operation points of respective transistors. The P-type transistor 1201 functions as a switch to turn on or off the current source circuit. A control signal V1201 is supplied to the gate of the transistor 1201 and controls turning on/off of the transistor 1201. The N-type transistor 1204 is a gate-grounded transistor. A control signal V1204 is a fixed bias voltage to determine the operation point. The N-type transistor 1205 is a source-grounded transistor. An input signal Vampi is input to the gate of the transistor 1205 instead of a control signal. An output signal Vampo of the inverting amplifier 1112 is output to a common node of the transistor 1204 and the transistor 1203.

Here, a gain Ao of the inverting amplifier 1112 is expressed by Equation (3).

$$Ao = \frac{Vampo}{Vampi} = -gmR \qquad \text{Equation (3)}$$

Here, the source-grounded N-type transistor 1205 has a mutual conductance gm and an output resistance R. If the RTN deteriorated in the transistor 1202 or the transistor 1203, the drain current of the transistor 1205 would change, and the mutual conductance gm of the transistor 1205 would change. As a result, as described in Equation (3), the gain Ao will change. This means that, if a certain signal were input, the signal amplified by a single inverting amplifier 1112 would cause variation in the signal magnitude in accordance with the timing (time) of the amplification. Further, with a plurality of inverting amplifiers 1112 being provided, even when a constant signal is input, a plurality of amplified signals may cause variation in the signal magnitude. It is therefore the first-type transistor of the P-type is applied to the P-type transistor 1202 and the P-type transistor 1203 that form the current source circuit. Further, the control signals V1204 and V1205 are input to the transistor 1204 and the transistor 1205 to determine the operation points to respective gates. Since a change in a drain current causes a change in the operation, in one embodiment, the first-type transistor is applied to such transistors. In other words, the first-type transistor of the N-type is applied to the N-type transistor 1204 and the N-type transistor 1205. As described in the present embodiment, by applying the first-type transistor to at least the transistor 1202 and the transistor 1203 in the signal amplifier circuit 1004, it is possible to suppress deterioration of a signal.

Seventh Embodiment

Figure 13:
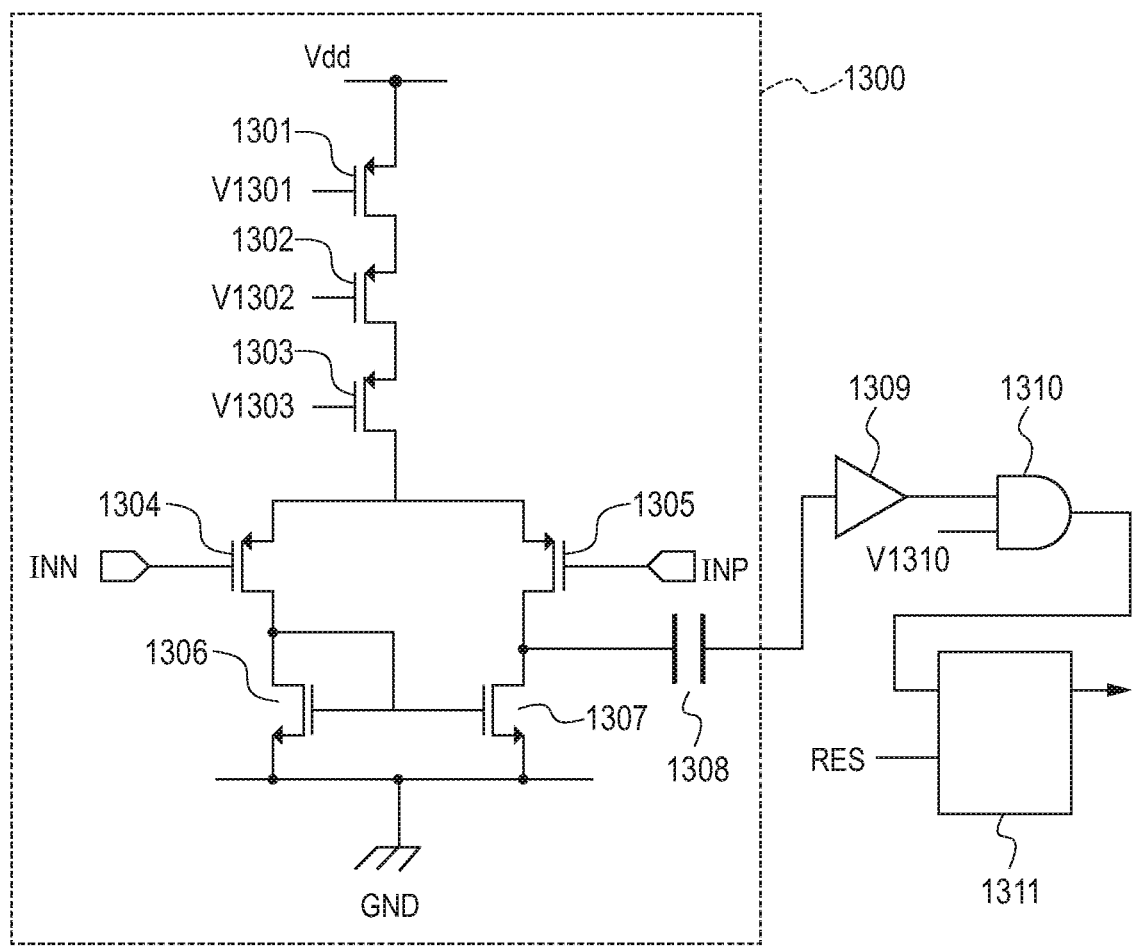
FIG. 13 is an equivalent circuit diagram illustrating a photoelectric conversion device according to a seventh embodiment.

A photoelectric conversion device of the present embodiment will be described by using FIG. 13. FIG. 13 is an equivalent circuit diagram illustrating the photoelectric conversion device of the present embodiment. FIG. 13 illustrates the AD converter circuit 1005 illustrated in FIG. 10 or FIG. 11. The AD converter circuit 1005 includes at least a comparator 1300. The comparator 1300 includes transistors 1301 to 1307. The P-type transistor 1301 and the P-type transistor 1302 are cascode-connected to each other to form a current source circuit. The P-type transistor 1303 may function as a switch to turn on or off the current source circuit. A control signal V1303 is supplied to the gate of the transistor 1303 and controls conduction of the transistor 1303. The P-type transistor 1304 functions as an input transistor. A ramp signal output from the ramp generation circuit 1006 illustrated in FIG. 10 is input to the gate of the transistor 1304. The P-type transistor 1305 functions as an input transistor. The amplified signal Vampo output from the signal amplifier circuit 1004 illustrated in FIG. 10 is input to the gate of the transistor 1305. In FIG. 13, the gate of the transistor 1304 is denoted as an input end INN, and the gate of the transistor 1305 is denoted as an input end INP. The drain of the transistor 1304 is electrically connected to the drain of the N-type transistor 1306, and the drain of the transistor 1305 is electrically connected to the drain of the N-type transistor 1307. The comparator 1300 of such a circuit outputs a result of comparison of the signal voltage Vampo due to an optical signal and the ramp signal serving as the reference signal. The output is output to the node to which the transistor 1305 and the transistor 1307 are connected, which may affect the comparison result through a capacitor, a latching circuit, and a logic circuit, in response to a change of the current value in the current source circuit. It is thus the first-type transistor is applied to at least the transistor 1301 and the transistor 1302 of the comparator 1300. Further, the first-type transistor may be applied to the transistors 1304 to 1307. As described in the present embodiment, by applying the first-type transistor to at least the transistor 1202 and the transistor 1203 in the AD converter circuit 1005, it is possible to suppress deterioration of a signal.

Eighth Embodiment

In each of the fifth to seventh embodiments, in the photoelectric conversion device, details of the circuit in which the first-type transistor is provided have been described. In the present embodiment, a portion of the photoelectric conversion device to which the first-type transistor is provided will be described. FIG. 14 is a table illustrating a photoelectric conversion device according to the present embodiment. FIG. 14 illustrates portions to which the first-type transistor is applied in each block of the photoelectric conversion device illustrated in FIG. 10. When a block listed in the column of block names includes the first-type transistor, a symbol "circle (O)" is placed in the column of the first-type transistor, and when a block listed in the column of block names does not include the first-type transistor, a symbol "cross (X)" is placed in the column of the first-type transistor. First, by applying the first-type transistor to the unit cell portion 1000, it is possible to reduce influence, on the PD, of a dark current (leak current) which occurs in the periphery of the element isolation portion. Furthermore, as described in the fifth to seventh embodiments, the first-type transistor is applied to a portion where noise may be superimposed on a signal of at least one of the current source circuit 1003, the signal amplifier circuit 1004, and the AD converter circuit 1005 in the signal readout unit. The first-type transistor is applied to a portion where noise may be superimposed on the signals of the three circuits.

On the other hand, in one embodiment, the first-type transistor is not to be applied but the second-type transistor is to be applied to a transistor in a complete on-state, for example, a transistor that functions as a switch in a circuit of a signal readout unit. For example, a control signal used for turning on and off a transistor that functions as a switch is the ground voltage GND when the transistor is a P-type transistor and the power source voltage Vdd when the transistor is an N-type transistor. Since an even inversion region is generated in the channel of the transistor to which such a control signal is supplied, a current is concentrated at the channel end near the element isolation portion and hardly flows. Therefore, since the RTN is less likely to increase, the second-type transistor instead of the first-type transistor can be applied. The semiconductor region 52 and the semiconductor region 54 that have a conductivity opposite to the polarity of the transistor are not provided to the second-type transistor. That is, a p-n junction interface between the source and the drain of the transistor and the semiconductor region 52 or the semiconductor region 54 of the opposite conductivity is not formed. It is therefore possible to suppress a reduction in the withstand voltage due to a p-n junction. Further, when the effective channel width of a transistor is reduced, an on-resistance increases, which may cause a reduction in the drive speed. Therefore, in a circuit where high speed driving is used, the second-type transistor is applied instead of the first-type transistor. A circuit in which high speed driving is used may be the vertical scanning circuit 1002, the ramp generation circuit 1006, the memory circuit 1007, the horizontal scanning circuit 1015, the counter circuit 1008, the TG 1009, the signal processing circuit 1010, the signal output circuit 1011, or the like.

As illustrated in the present embodiment, in a device such as a photoelectric conversion device in which a reduction of noise superimposed on a signal is desired, by applying the first-type transistor in at least one circuit of the readout circuit portion, it is possible to reduce noise superimposed on a signal.

Ninth Embodiment

In the present embodiment, a modified example of the inverting amplifier 1112 in FIG. 11 illustrated in the fifth embodiment will be described. In the present embodiment, the inverting amplifier 1112 is changed from a single input amplifier to a differential amplifier. Other features of the present embodiment are the same as the features described in the fifth embodiment.

Figure 15:
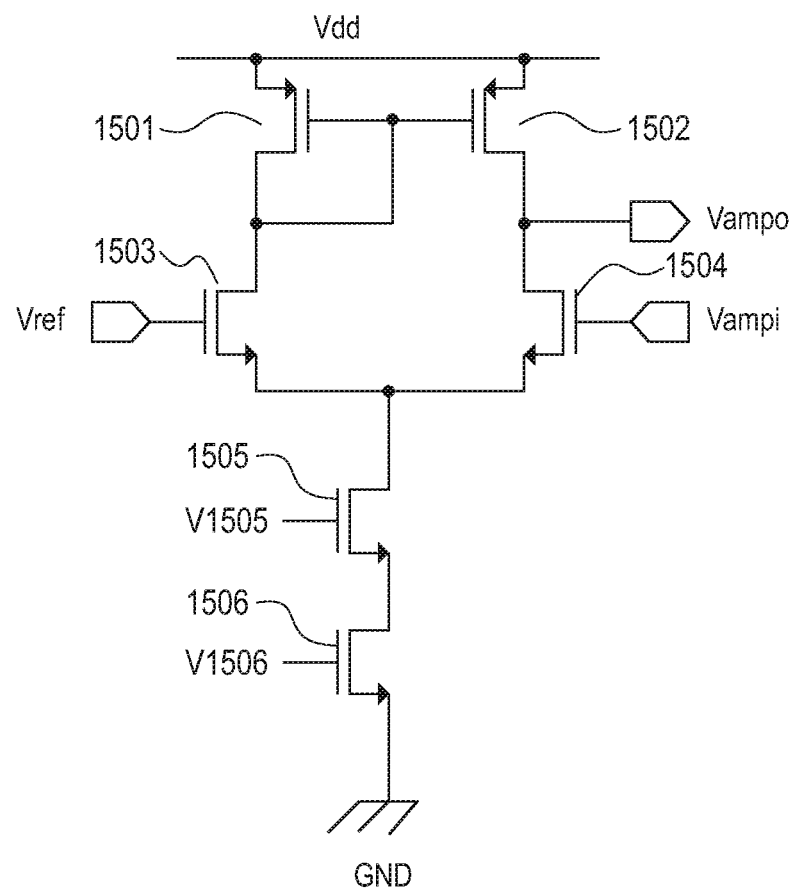
FIG. 15 is an equivalent circuit diagram illustrating a photoelectric conversion device according to a ninth embodiment.

FIG. 15 is an equivalent circuit diagram illustrating a photoelectric conversion device according to the present embodiment. FIG. 15 illustrates the inverting amplifier 1112. The inverting amplifier 1112 is a differential amplifier. A P-type transistor 1501, a P-type transistor 1502, an N-type transistor 1503, and an N-type transistor 1504 form a differential pair. An N-type transistor 1506 forms a current source circuit. An N-type transistor 1505 functions as a switch used for turning on or off the current. A signal is input to the input end that is the gate of the transistor 1504 as the voltage Vampi. A reference signal Vref is input to other input ends. A difference between the voltages input to the two input ends is amplified and output from the output end as the voltage Vampo. Here, as described in the fifth embodiment, when the RTN of the transistor deteriorates, the current amount in the differential amplifier changes. At this time, when the current flowing in the differential pair becomes unbalanced, the voltage Vampo that is an output signal changes. Here, by forming the differential amplifier of the first-type transistor, it is possible to reduce RTN and improve signal quality. Further, the second-type transistor is used for the transistor 1505 that functions as a switch.

The configuration of the present embodiment can also provide a photoelectric conversion device with reduced noise.

Tenth Embodiment

In the present embodiment, an example of a photoelectric conversion device will be described. The photoelectric conversion device of the present embodiment is formed such that at least two semiconductor substrates used for stacking are electrically connected and stacked. Such a photoelectric conversion device is also referred to as a stacked-type photoelectric conversion device. Here, the semiconductor substrate may also be referred to as a member or a chip.

Figure 16:
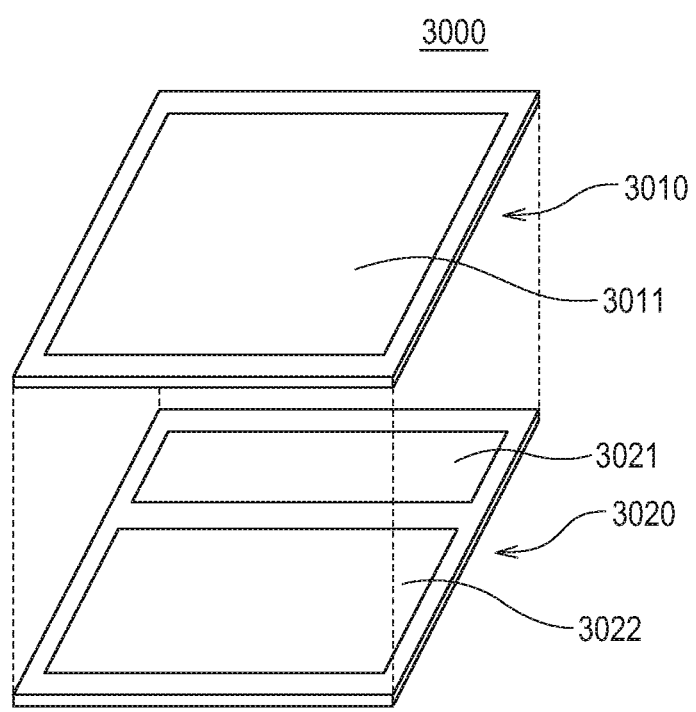
FIG. 16 is a perspective view illustrating a stacked photoelectric conversion device.

FIG. 16 is a schematic diagram of a photoelectric conversion device 3000 of the present embodiment and is a perspective exploded view of the photoelectric conversion device 3000. A pixel region 3011 is provided in one semiconductor substrate 3010. A control unit 3021 and a signal processing unit 3022 are provided in a different semiconductor substrate 3020. The pixel region 3011 corresponds to a photoelectric conversion unit to which the unit cell including a photoelectric conversion element is arranged. The signal processing unit 3022 is provided with the semiconductor memory described in the first embodiment or the like. At least a part of respective orthogonal projection of the control unit 3021 and the signal processing unit 3022 to the semiconductor substrate 3010 overlaps with the pixel region 3011. Note that the photoelectric conversion device 3000 of the present embodiment may further have a semiconductor substrate having another processing circuit or may have three or more semiconductor substrates used for stacking.

The control unit 3021 may have a vertical scanning circuit that provides a drive signal to a pixel or a power source circuit. Further, the control unit 3021 may include a timing generation circuit used for driving the photoelectric conversion device, a reference signal supply circuit configured to supply a reference signal to a converter circuit, or a horizontal scanning circuit used for reading out a signal sequentially from an amplifier circuit or a converter circuit.

The signal processing unit 3022 processes an electrical signal based on signal charges generated in a pixel region. The signal processing unit 3022 may include a noise removal circuit, an amplifier circuit, a converter circuit, or an image signal processing circuit. The noise removal circuit is a correlated double sampling (CDS) circuit, for example. The amplifier circuit is a column amplifier circuit, for example. The converter circuit is an analog-to-digital conversion (ADC) circuit formed of a comparator and a counter, for example. The image signal processing circuit includes a memory device and a processor, for example, and is configured to generate image data from an analog-to-digital converted digital signal or perform image processing on image data.

The disclosure is also applicable to such a photoelectric conversion device in which a plurality of semiconductor substrates are stacked as described in the present embodiment.

Eleventh Embodiment

Figure 17:
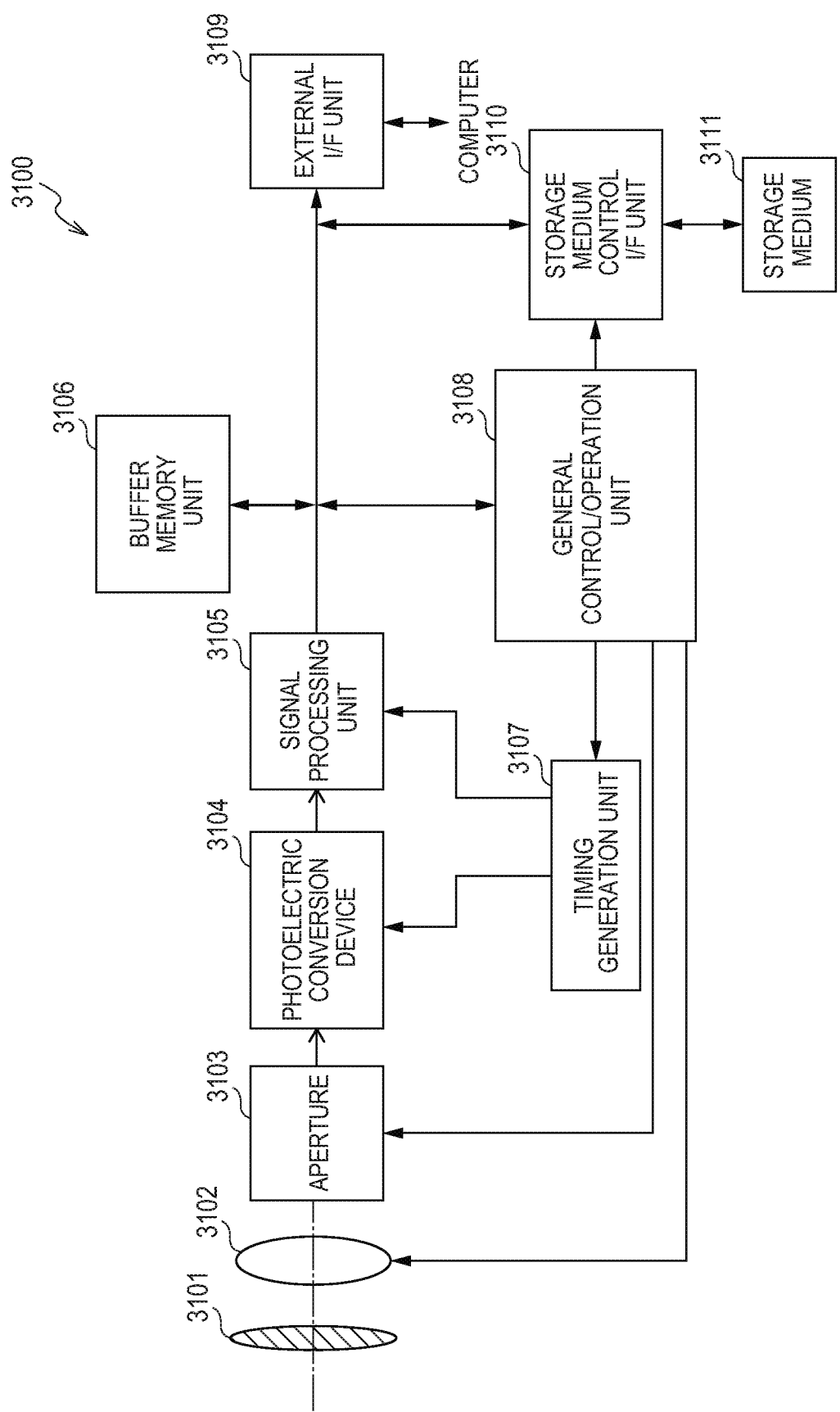
FIG. 17 is a diagram illustrating a configuration of an imaging system.

FIG. 17 is a block diagram illustrating a configuration of an imaging system 3100 according to the present embodiment. The imaging system 3100 of the present embodiment includes the photoelectric conversion device 3104 described in the embodiments described above. Here, any of the photoelectric conversion devices described above can be applied to the photoelectric conversion device 3104. A specific example of the imaging system 3100 may be a digital still camera, a digital come coder, a surveillance camera, or the like. FIG. 10 illustrates an example of a digital still camera as the imaging system 3100.

The imaging system 3100 illustrated in FIG. 10 as an example has the photoelectric conversion device 3104, a lens 3102 that captures an optical image of a subject onto the photoelectric conversion device 3104, an aperture 3103 used for changing the amount of light that has passed through the lens 3102, and a barrier 3101 used for protecting the lens 3102. The lens 3102 and the aperture 3103 form an optical system that converges light onto the photoelectric conversion device 3104.

The imaging system 3100 has the signal processing unit 3105 that processes output signals output from the photoelectric conversion device 3104. The signal processing unit 3105 performs a signal processing operation that performs various correction or compression on an input signal for output, if necessary. The imaging system 3100 further has a buffer memory unit 3106 used for temporarily storing image data and an external interface unit (external I/F unit) 3109 used for communicating with an external computer or the like. The imaging system 3100 further has a storage medium 3111 such as a semiconductor memory used for performing storage or readout of imaging data and a storage medium control interface unit (storage medium control I/F unit) 3110 used for performing storage or readout on the storage medium 3111. Note that the storage medium 3111 may be embedded in the imaging system 3100 or may be removable. Further, communication from the storage medium control I/F unit 3110 to the storage medium 3111 or communication from the external I/F unit 3109 may be wirelessly performed.

Furthermore, the imaging system 3100 has a general control/operation unit 3108 that performs various operations and controls the entire digital still camera and a timing generation unit 3107 that outputs various timing signals to the photoelectric conversion device 3104 and the signal processing unit 3105. Here, a timing signal or the like may be input from the outside, and the imaging system 3100 has at least the photoelectric conversion device 3104 and the signal processing unit 3105 that processes output signals output from the photoelectric conversion device 3104. Note that, as described in the sixth embodiment, the timing generation unit 3107 may be embedded in the photoelectric conversion device. The general control/operation unit 3108 and the timing generation unit 3107 may be configured to perform a part or all of the control function of the photoelectric conversion device 3104.

The photoelectric conversion device 3104 outputs an imaging signal to the signal processing unit 3105. The signal processing unit 3105 performs predetermined signal processing on an imaging signal output from the photoelectric conversion device 3104 and outputs image data. Further, the signal processing unit 3105 uses an imaging signal to generate an image. Note that the signal processing unit 3105 or the timing generation unit 3107 may be embedded in the photoelectric conversion device. That is, the signal processing unit 3105 or the timing generation unit 3107 may be provided on a substrate in which pixels are arranged or may be provided in a different substrate as described in FIG. 16. By forming the imaging system by using the photoelectric conversion device of each embodiment described above, an imaging system that can acquire a higher quality image can be realized.

Twelfth Embodiment

Figure 18A:
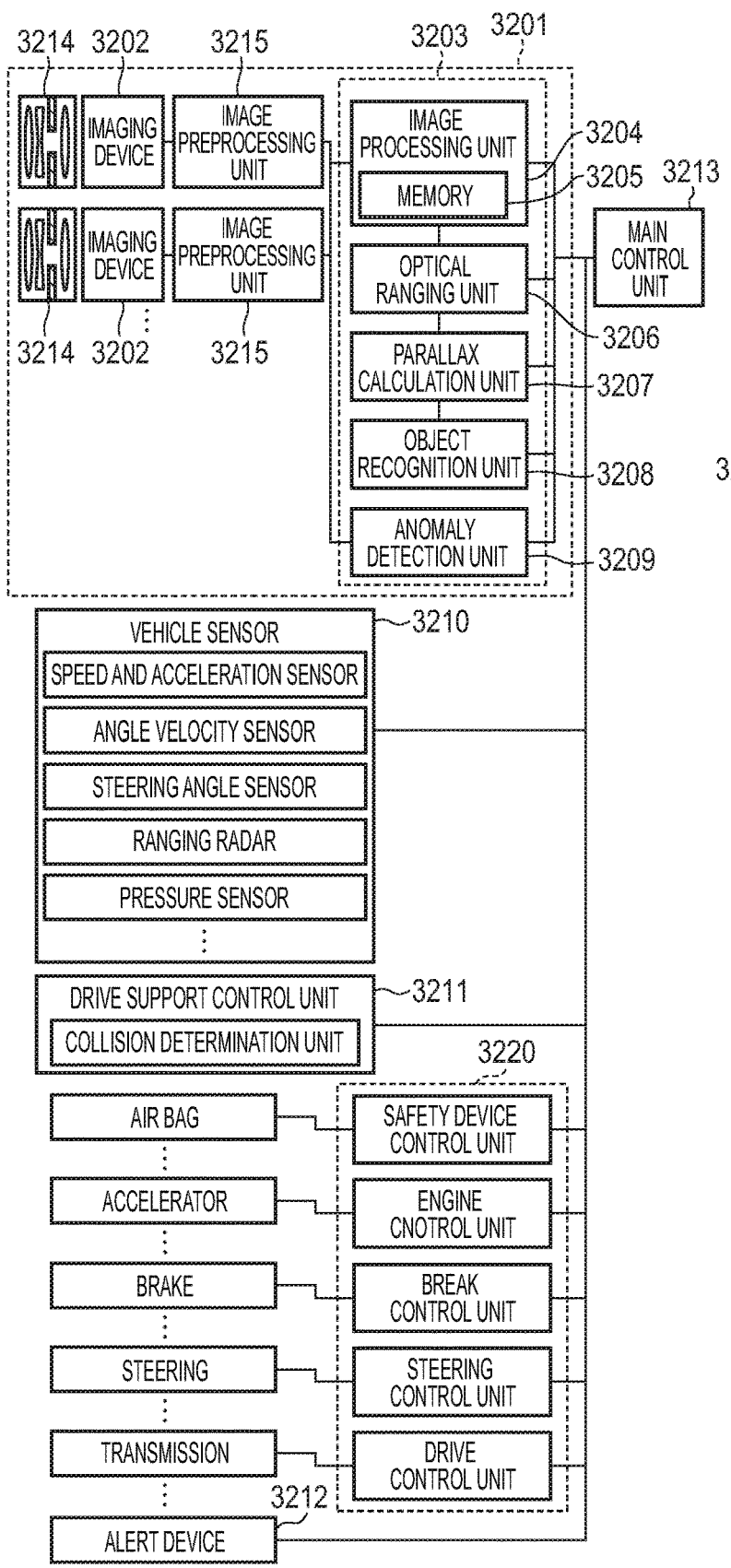
FIG. 18A is a diagram illustrating a configuration of a moving unit.
Figure 18B:
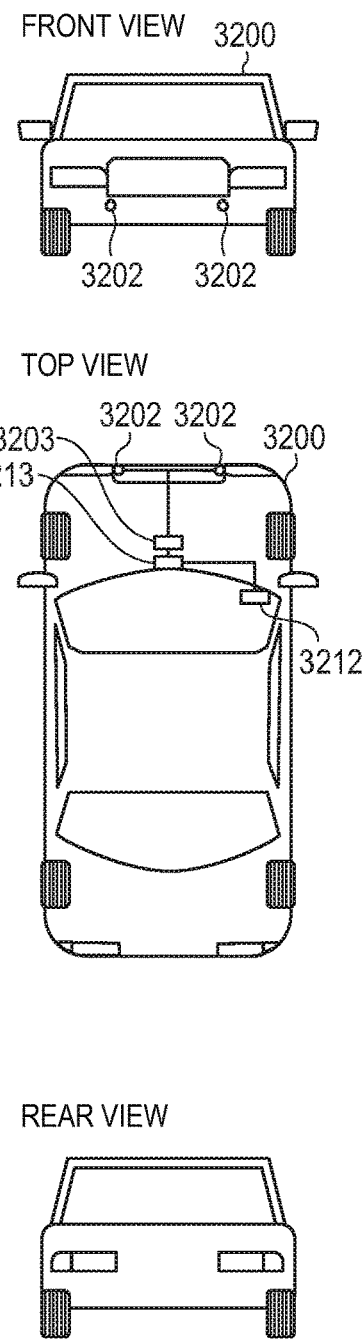
FIG. 18B is another diagram illustrating the configuration of the moving unit.

A moving unit of the present embodiment will be described by using FIG. 18A and FIG. 18B and FIG. 19. FIG. 18A and FIG. 18B are schematic diagrams illustrating a configuration example of the moving unit according to the present embodiment. FIG. 19 is a flow diagram illustrating an operation of the imaging system embedded in the moving unit according to the present embodiment. In the present embodiment, one example of an on-vehicle camera is illustrated as the imaging system. In the description below, the imaging device is any of the photoelectric conversion devices of respective embodiments described above.

FIG. 18A illustrates an example of a vehicle system and an imaging system mounted thereon. An imaging system 3201 includes imaging devices 3202, image preprocessing units 3215, an integrated circuit 3203, and optical systems 3214. Each of the optical systems 3214 captures an optical image of a subject on the imaging device 3202. Each of the imaging devices 3202 converts an optical image of a subject captured by the optical system 3214 into an electrical signal. Each of the image preprocessing units 3215 performs predetermined signal processing on a signal output from the imaging device 3202. The function of the image preprocessing unit 3215 may be embedded in the imaging device 3202. The imaging system 3201 is provided with at least two sets of the optical system 3214, the imaging device 3202, and the image preprocessing unit 3215, and the output from the image preprocessing units 3215 of respective sets is input to the integrated circuit 3203.

The integrated circuit 3203 is an application specific integrated circuit for the imaging system and includes an image processing unit 3204 including a memory 3205, an optical ranging unit 3206, a parallax calculation unit 3207, an object recognition unit 3208, and an anomaly detection unit 3209. The image processing unit 3204 performs image processing such as development process, defection correction, or the like on the output signal from the image preprocessing unit 3215. The memory 3205 stores primary storage of a captured image or a defection position of a captured image. The optical ranging unit 3206 performs focusing or ranging of a subject. The parallax calculation unit 3207 calculates a parallax information (a phase difference of parallax images) from a plurality of image data acquired by the plurality of imaging devices 3202. The object recognition unit 3208 recognizes a subject such as an automobile, a road, a traffic sign, a person, or the like. In response to detection of an anomaly of the imaging device 3202, the anomaly detection unit 3209 reports the anomaly to a main control unit 3213.

The integrated circuit 3203 may be implemented by dedicatedly designed hardware, may be implemented by a software module, or may be implemented by the combination thereof. Further, the integrated circuit 3203 may be implemented by a Field Programmable Gate Array (FPGA), an Application Specific Integrated Circuit (ASIC), or the like, or may be implemented by the combination thereof.

The main control unit 3213 integrally controls the operation of the imaging system 3201, a vehicle sensor 3210, a control unit 3220, or the like. Note that the imaging system 3201, the vehicle sensor 3210, and the control unit 3220 may have separate communication interfaces without the main control unit 3213, and a method of transmitting and receiving control signals by respective components via the communication network (for example, CAN specification) may be employed.

The integrated circuit 3203 has a function of transmitting a control signal and a setting value to the imaging device 3202 in response to receiving the control signal from the main control unit 3213 or by using a control unit of the integrated circuit 3203.

The imaging system 3201 is connected to the vehicle sensor 3210 and can sense a traveling state of the vehicle, such as a vehicle speed, a yaw rate, a steering angle, or the like, and a state of an environment outside the vehicle or another vehicle and an obstacle. The vehicle sensor 3210 also serves as a distance information acquisition unit that acquires information on the distance from the parallax image to the object. Further, the imaging system 3201 is connected to a drive support control unit 3211 that performs various drive supports such as automatic steering, automatic patrol, collision prevention function, or the like. In particular, with respect to the collision determination function, estimation of a collision and determination of a collision against another vehicle and an obstacle are performed based on the sensing result of the imaging system 3201 or the vehicle sensor 3210. Thereby, avoidance control when a collision is estimated or startup of a safety device at a collision is performed.

Further, the imaging system 3201 is connected to an alert device 3212 that issues an alert to a driver based on the determination result in a collision determination unit. For example, when the determination result of the collision determination unit indicates a high possibility of collision, the main control unit 3213 performs vehicle control to avoid a collision or reduce damage by applying a break, moving back the accelerator pedal, suppressing the engine power, or the like. The alert device 3212 performs an alert to a driver by sounding an alert such as a sound, displaying alert information on a display unit screen such as a car navigation system, a meter panel, or the like, providing a vibration to a sheet belt or a steering wheel, or the like.

In the present embodiment, the surrounding area of the vehicle, for example, the area in front or rear is captured by the imaging system 3201. FIG. 18B illustrates an arrangement example of the imaging system 3201 when the area in front of the vehicle is captured by the imaging system 3201.

The two imaging devices 3202 are arranged in the front of the vehicle 3200. Specifically, in terms of acquisition of the distance information or determination of the possibility of collision between the vehicle 3200 and the captured object, the center line is defined with respect to the direction of traveling back and forth or the external shape (for example, the vehicle width) of the vehicle 3200 as a symmetry axis and arrange the two imaging devices 3202 in a symmetrical manner with respect to the symmetry axis. Further, in one embodiment, the imaging devices 3202 is arranged so as not to block the driver's field of view when the driver views the status outside the vehicle 3200 out of the driver seat. It is preferable to arrange the alert device 3212 so as to be easily viewed by the driver.

Next, a failure detection operation of the imaging device 3202 in the imaging system 3201 will be described by using FIG. 19. The failure detection operation of the imaging device 3202 is performed in accordance with steps S3310 to S3380 illustrated in FIG. 19.

Step S3310 is a step of performing a setting at startup of the imaging device 3202. That is, a setting used for the operation of the imaging device 3202 is transmitted from the outside of the imaging system 3201 (the main control unit 3213, for example) or the inside of the imaging system 3201, and a capturing operation and a failure detection operation of the imaging device 3202 are started.

Next, in step S3320, a pixel signal is acquired from an effective pixel. Further, in step S3330, an output value from a failure detection pixel provided for failure detection is acquired. The failure detection pixel has a photoelectric conversion unit as with the effective pixel. A predetermined voltage is written to the photoelectric conversion unit. The failure detection pixel outputs a signal corresponding to the voltage written in the photoelectric conversion unit. Note that step S3320 and step S3330 may be performed in reverse order.

Next, in step S3340, classification between an expected output value of a failure detection pixel and an actual output value from a failure detection pixel is performed. As a result of the classification in step S3340, if there is a match between the expected output value and the actual output value, the process proceeds to step S3350, it is determined that the imaging operation is normally performed, and the process step proceeds to step S3360. In step S3360, a pixel signal on a scanning row is transmitted to the memory 3205 and temporarily stored. The process then returns to step S3320 to continue the failure detection operation. On the other hand, as a result of the classification in step S3340, if there is no match between the expected output value and the actual output value, the process step proceeds to step S3370. In step S3370, it is determined that there is an anomaly in the imaging operation, and an alert is reported to the main control unit 3213 or the alert device 3212. The alert device 3212 causes a display unit to display that an anomaly has been detected. Then, in step S3380, the imaging device 3202 is stopped, and the operation of the imaging system 3201 ends.

Note that, although the example in which the flowchart is looped on a row basis has been described in the present embodiment, the flowchart may be looped on a multiple-row basis, or a failure detection operation may be performed on a frame basis. Note that the reporting of the alert in step S3370 may be noticed to the outside of the vehicle via a wireless network.

Further, although control for avoiding a collision to another vehicle has been described in the present embodiment, the embodiment is also applicable to automatic driving control for following another vehicle, automatic driving control for not going out of a traffic lane, or the like. Furthermore, the imaging system 3201 is not limited to a vehicle such as a subject vehicle and can be applied to a moving unit (moving apparatus) such as a ship, an airplane, or an industrial robot, for example. In addition, the imaging system can be widely applied to a device which utilizes object recognition, such as an intelligent transportation system (ITS), without being limited to moving units.

Thirteenth Embodiment

In the present embodiment, a manufacturing method of a photoelectric conversion device or a semiconductor memory will be described. With regard to the present embodiment, reference to the drawings or the detailed description of the embodiments described above will be appropriately made. The photoelectric conversion device has a Static Random Access Memory (SRAM)-type memory unit including a first transistor of the first conductivity type and a second transistor of the second conductivity type and a photoelectric conversion unit including a photoelectric conversion element.

A manufacturing method of the photoelectric conversion device has steps of preparing a semiconductor substrate having a first region, a second region, and a third region and forming grooves in the first region, the second region, and the third region by using a first mask pattern. Further, the manufacturing method has steps of forming a second mask pattern, performing implantation of impurity ions of the first conductivity type, and forming a first element isolation portion, a second element isolation portion, and a third element isolation portion. The manufacturing method further has steps of forming the first transistor and the second transistor and forming the photoelectric conversion element.

In the step of forming the second mask pattern, the second mask pattern that covers the groove formed in the first region and exposes the groove formed in the second region and the groove formed in the third region is formed on the first mask pattern. In the step of performing the implantation of impurity ions of the first conductivity type, implantation of impurity ions of the first conductivity type is performed on the semiconductor substrate via the groove formed in the second region and the groove formed in the third groove by using the first mask pattern and the second mask pattern. In the step of forming the first element isolation portion, the second element isolation portion, and the third element isolation portion, an insulator is embedded in the groove formed in the first region, the groove formed in the second region, and the groove formed in the third region. The first element isolation portion in the first region, the second element isolation portion in the second region, and the third element isolation portion in the third region are then formed. In the step of forming the first transistor and the second transistor, the first transistor is formed in the first region, and the second transistor is formed in the second region. In the step of forming the photoelectric conversion element, the photoelectric conversion element is formed in the third region. By having such steps, it is possible to manufacture a photoelectric conversion device having small transistors while suppressing an increase in the number of steps.

Further, the manufacturing method may also have a step of forming a third transistor of the second conductivity type in the third region. At this time, the gate electrode of the first transistor extends on the first element isolation portion, the gate electrode of the second transistor extends on the second element isolation portion, and the gate electrode of the third transistor extends on the third element isolation portion. Further, in the manufacturing method, the first mask pattern may be made of an inorganic material, and the second mask pattern may be made of an organic material.

Further, the photoelectric conversion device includes a fourth transistor of the first conductivity type and a fifth transistor of the second conductivity type and may have a processing circuit portion that processes signals from the photoelectric conversion element. At this time, the semiconductor substrate has a fourth region and a fifth region. The manufacturing method then has steps of forming grooves in the fourth region and the fifth region, forming a fourth element isolation portion and a fifth element isolation portion, and forming the fourth transistor and the fifth transistor. In the step of forming the fourth element isolation portion and the fifth element isolation portion, an insulator is embedded in the groove formed in the fourth region and the groove formed in the fifth region to form the fourth element isolation portion in the fourth region and the fifth element isolation portion in the fifth region. In the step of forming the fourth transistor and the fifth transistor, the fourth transistor is formed in the fourth region, and the fifth transistor is formed in the fifth region. Here, the step of forming the second mask pattern is performed after the step of forming the grooves in the fourth region and the fifth region, and the second mask pattern covers the fourth region and the fifth region.

Further, the first to fifth element isolation portions may be element isolation of the STI structure. Further, in the step of performing implantation of impurity ions, the implantation of impurity ions is performed obliquely with respect to the surface of the semiconductor substrate.

Further, the manufacturing method of the present embodiment can also be applied to a semiconductor memory. For example, a semiconductor memory has a Static Random Access Memory (SRAM)-type unit cell including the first transistor of the first conductivity type and the second transistor of the second conductivity type. The manufacturing method of the semiconductor memory has steps of preparing a semiconductor substrate having the first region and the second region, forming the first groove and the second groove, and forming the second mask pattern. The manufacturing method further has steps of performing implantation of impurity ions, forming the first element isolation portion and the second element isolation portion, and forming the first transistor and the second transistor. In the step of forming the first groove and the second groove, the first groove is formed in the first region and the second groove is formed in the second region by using the first mask pattern. In the step of forming the second mask pattern, the second mask pattern having an opening that covers the first groove and the exposes the second groove is formed on the first mask pattern. In the step of performing the implantation of impurity ions, implantation of impurity ions of the first conductivity is performed on the semiconductor substrate via the second groove by using the first mask pattern and the second mask pattern. In the step of forming the first element isolation portion and the second element isolation portion, an insulator is embedded in the first groove and the second groove to form the first element isolation portion having the first groove and the second element isolation portion having the second groove. The step of forming the first transistor and the second transistor has a step of forming the first transistor in the first region and forming the second transistor in the second region. By having such steps, it is possible to manufacture a semiconductor memory having small transistors while suppressing an increase in the number of steps.

The photoelectric conversion device of the aspect of the embodiments may further have a color filter or a micro-lens or may be configured to be able to acquire various information such as distance information. For example, a plurality of photoelectric conversion elements may be included in one input node, and a single micro-lens may be commonly provided to a plurality of photoelectric conversion elements. Further, the amplification transistor forming a portion of the source follower circuit may form a portion of an AD convertor. Specifically, a part of a comparator included in the AD convertor may be formed of the amplification transistor. Further, some components of the comparator may be provided to another semiconductor substrate. Further, a unit circuit may have no transfer transistor, and the photoelectric conversion element may be directly connected to the input node. Furthermore, a charge drain portion such as an overflow drain may be provided.

The disclosure is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is one of the embodiments of the disclosure. Although the example of a semiconductor memory, a photoelectric conversion device, or the like have been described in the embodiments described above, the structure according to the transistor of the aspect of the embodiments is also applicable to other devices. Any of the embodiments described above merely illustrates embodied examples in implementing the disclosure, and the technical scope of the disclosure is not to be construed in a limiting sense by these examples. That is, the aspect of the embodiments can be implemented in various forms without departing from the technical concept thereof or the primary features thereof.

The aspect of the embodiments can improve characteristics of a transistor.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-196846, filed Oct. 18, 2018, and Japanese Patent Application No. 2019-089187, filed May 9, 2019, which are hereby incorporated by reference herein in their entirety.

What is claimed is:

1. A memory comprising a Static Random Access Memory (SRAM)-type unit cell including a first transistor of a first conductivity type and a second transistor of a second conductivity type,
   wherein the first transistor is arranged in an active region of a semiconductor substrate,
   wherein the active region overlaps with a gate electrode of the first transistor and includes a portion located between a source and a drain of the first transistor,
   wherein the portion is arranged across a first position, a second position, and a third position aligning in order along a channel width direction of the first transistor,
   wherein the portion includes a first semiconductor region of the second conductivity type arranged in the first position and a second semiconductor region of the second conductivity type arranged in the second position, wherein an impurity concentration of the first semiconductor region is higher than an impurity concentration of the second semiconductor region,
wherein the unit cell includes a third transistor of the first conductivity type and a fourth transistor of the second conductivity type,
wherein the first transistor and the third transistor function as a load transistor, and
wherein the second transistor and the fourth transistor function as a driver transistor.

2. The memory according to claim 1,
wherein a channel of the first transistor is formed at the second position.

3. The memory according to claim 1,
wherein, in the portion, a third semiconductor region of the second conductivity type is arranged at the third position, and
wherein an impurity concentration of the third semiconductor region is higher than the impurity concentration of the second semiconductor region.

4. The memory according to claim 1, wherein the first conductivity is a P-type, and the second conductivity type is an N-type.

5. The memory according to claim 1, wherein when the gate electrode of the first transistor is turned on, each of the impurity concentration of the first semiconductor region and the impurity concentration of the second semiconductor region is an impurity concentration at which a channel is formed at the second position.

6. The memory according to claim 1, wherein the impurity concentration of the first semiconductor region and the impurity concentration of the second semiconductor region satisfy $C1 \geq 2 \times C2$, where C1 denotes the impurity concentration of the first semiconductor region and C2 denotes the impurity concentration of the second semiconductor region.

7. The memory according to claim 6, wherein the impurity concentration of the first semiconductor region and the impurity concentration of the second semiconductor region satisfy $C1 \geq 10 \times C2$.

8. The memory according to claim 1,
wherein the active region is adjacent to an element isolation portion having a trench in a plan view, and
wherein the gate electrode of the first transistor extends on the element isolation portion.

9. The memory according to claim 8, wherein the first position is located between a side face of the trench and the second position.

10. A photoelectric conversion device comprising:
the memory according to claim 1; and
a photoelectric conversion unit in which a photoelectric conversion element is arranged,
wherein the memory and the photoelectric conversion unit are on a single substrate.

11. A photoelectric conversion device comprising:
the memory according to claim 1; and
a photoelectric conversion unit in which a photoelectric conversion element is arranged,
wherein a substrate on which the memory is provided and a substrate on which the photoelectric conversion unit is provided are stacked.

12. A system comprising:
the photoelectric conversion device according to claim 11; and
a signal processing unit that processes a signal from the photoelectric conversion device.

13. A moving unit comprising:
the photoelectric conversion device according to claim 11; and
an acquisition unit that acquires distance information on a distance to an object, from parallax information based on signals from the photoelectric conversion device; and
a control unit that controls the moving unit based on the distance information.

14. A photoelectric conversion device comprising:
a unit cell portion in which a plurality of unit cells are arranged, wherein each of the plurality of unit cells has a photoelectric conversion element; and
a readout unit used for reading out a signal from the unit cell portion, and arranged in a portion other than the unit cell portion,
wherein the readout unit has at least one first transistor of a first conductivity type,
wherein the first transistor is arranged in an active region of a semiconductor substrate,
wherein the active region overlaps with a gate electrode of the first transistor and includes a first portion located between a source and a drain of the first transistor,
wherein the first portion is arranged across a first position, a second position, and a third position aligned in order along a channel width direction of the first transistor,
wherein the first portion includes a first semiconductor region of the second conductivity type arranged at the first position and a second semiconductor region of the second conductivity type arranged at the second position, and
wherein an impurity concentration of the first semiconductor region is higher than an impurity concentration of the second semiconductor region.

15. The photoelectric conversion device according to claim 14,
wherein the readout unit includes at least one of a current source circuit, a signal amplifier circuit, and an analog-to-digital converter circuit, and
wherein the at least one of the current source circuit, the signal amplifier circuit, and the analog-to-digital converter circuit includes the first transistor.

16. The photoelectric conversion device according to claim 14,
wherein the readout unit includes at least a current source circuit and an analog-to-digital converter circuit, and
wherein the analog-to-digital conversion circuit includes a comparator having another current source circuit, and the current source circuit and the another current circuit include the first transistor.

17. The photoelectric conversion device according to claim 14,
wherein the readout unit has at least a second transistor of the first conductivity type, and the second transistor is arranged in another active region in the semiconductor substrate,
wherein the active region overlaps with a gate electrode of the second transistor and includes a second portion located between a source and a drain of the second transistor,
wherein the second portion is arranged across a fourth position, a fifth position, and a sixth position aligned in order along a channel width direction of the second transistor,
wherein the second portion includes a fourth semiconductor region of the second conductivity type arranged at the fourth position and a fifth semiconductor region of the second conductivity type arranged at the fifth position, and wherein the fourth semiconductor region and the fifth semiconductor region have a same impurity concentration.

18. The photoelectric conversion device according to claim 14, wherein the readout unit has at least a second transistor of the first conductivity type, and the second transistor is arranged in another active region in the semiconductor substrate, wherein the active region overlaps with a gate electrode of the second transistor and includes a second portion located between a source and a drain of the second transistor, wherein the second portion is arranged across a fourth position, a fifth position, and a sixth position aligned in order along a channel width direction of the second transistor, wherein the second portion includes a fourth semiconductor region of the second conductivity type arranged at the fourth position and a fifth semiconductor region of the second conductivity type arranged at the fifth position, and wherein the second conductivity is a P-type, and a difference between a maximum and a minimum of the impurity concentrations of the first semiconductor region and the second semiconductor region is smaller than a difference between the impurity concentration of the first semiconductor region and the impurity concentration of the second semiconductor region.

19. The photoelectric conversion device according to claim 14, wherein the unit cell includes a transfer transistor that transfers charges from the photoelectric conversion element and an amplification transistor that outputs a signal based on the charges, and wherein each of the transfer transistor and the amplification transistor is the first transistor.

20. A system comprising:

the photoelectric conversion device according to claim 14; and a processing unit that processes a signal from the photoelectric conversion device.

21. A moving unit comprising:

the photoelectric conversion device according to claim 14;

an acquisition unit that acquires distance information on a distance to an object, from parallax information based on signals from the photoelectric conversion device; and a control unit that controls the moving unit based on the distance information.

22. A moving unit comprising:

a photoelectric conversion device; and an acquisition unit that acquires distance information on a distance to an object, from parallax information based on signals from the photoelectric conversion device; and a control unit that controls the moving unit based on the distance information, wherein the photoelectric conversion device comprises:

a memory; and a photoelectric conversion unit in which a photoelectric conversion element is arranged, wherein a substrate on which the memory is provided and a substrate on which the photoelectric conversion unit is provided are stacked, wherein the memory comprising a Static Random Access Memory (SRAM)-type unit cell including a first transistor of a first conductivity type and a second transistor of a second conductivity type, wherein the first transistor is arranged in an active region of a semiconductor substrate, wherein the active region overlaps with a gate electrode of the first transistor and includes a portion located between a source and a drain of the first transistor, wherein the portion is arranged across a first position, a second position, and a third position aligning in order along a channel width direction of the first transistor, wherein the portion includes a first semiconductor region of the second conductivity type arranged in the first position and a second semiconductor region of the second conductivity type arranged in the second position, and wherein an impurity concentration of the first semiconductor region is higher than an impurity concentration of the second semiconductor region.

\* \* \* \* \*